(12) United States Patent
Shimakawa et al.

(10) Patent No.: US 10,249,558 B2
(45) Date of Patent: *Apr. 2, 2019

(54) ELECTRONIC PART MOUNTING HEAT-DISSIPATING SUBSTRATE

(71) Applicant: NSK Ltd., Tokyo (JP)

(72) Inventors: Shigeru Shimakawa, Tokyo (JP); Takashi Sunaga, Tokyo (JP); Takaaki Sekine, Tokyo (JP); Teruyoshi Kogure, Tokyo (JP); Ryoichi Suzuki, Maebashi (JP)

(73) Assignee: NSK LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/523,478

(22) PCT Filed: Nov. 20, 2015

(86) PCT No.: PCT/JP2015/082704
§ 371 (c)(1),
(2) Date: May 1, 2017

(87) PCT Pub. No.: WO2016/080521
PCT Pub. Date: May 26, 2016

(65) Prior Publication Data
US 2017/0309556 A1    Oct. 26, 2017

(30) Foreign Application Priority Data

Nov. 20, 2014  (JP) .................................. 2014-235691
Jul. 14, 2015   (JP) .................................. 2015-140106
(Continued)

(51) Int. Cl.
*H01L 23/495*     (2006.01)
*H02K 11/33*      (2016.01)
(Continued)

(52) U.S. Cl.
CPC ...... *H01L 23/49568* (2013.01); *B62D 5/0406* (2013.01); *G01R 1/203* (2013.01);
(Continued)

(58) Field of Classification Search
None
See application file for complete search history.

(56) References Cited

U.S. PATENT DOCUMENTS 9,184,585 B2 * 11/2015 Huselstein .............. H02M 1/32
9,397,030 B2 *  7/2016 Sunaga ................... H01L 24/37
(Continued)

FOREIGN PATENT DOCUMENTS

DE    102004036982 A1    3/2006
EP        0271163 A2     6/1988
(Continued)

OTHER PUBLICATIONS

International Search Report of PCT/JP2015/082704 dated Jan. 26, 2016 [PCT/ISA/210].

*Primary Examiner* — Telly Green
(74) *Attorney, Agent, or Firm* — Sughrue Mion, PLLC

(57) ABSTRACT

An electronic heat-dissipating substrate including: lead frames of wiring pattern shapes on a conductor plate; and an insulating member between the lead frames. A plate surface of the lead frames and a top surface of the insulating member form one continuous surface. The part arrangement surface is on both surfaces of the electronic part mounting heat-dissipating substrate, a reductant circuit which includes at least similar dual-system circuit is formed on the electronic part mounting heat-dissipating substrate, a first-system circuit of the dual-system circuit is formed on a first surface of the electronic part mounting heat-dissipating substrate, a second-system circuit of the dual-system circuit is formed on a second surface of the electronic part mounting heat-
(Continued)

dissipating substrate, and the common lead frames used in a portion of a circuit wiring are used to the first surface and the second surface of the electronic part mounting heat-dissipating substrate.

22 Claims, 26 Drawing Sheets

(30) Foreign Application Priority Data

| Nov. 2, 2015 | (JP) | 2015-216153 |
|---|---|---|
| Nov. 2, 2015 | (JP) | 2015-216154 |
| Nov. 2, 2015 | (JP) | 2015-216155 |
| Nov. 2, 2015 | (JP) | 2015-216156 |
| Nov. 4, 2015 | (JP) | 2015-216396 |
| Nov. 4, 2015 | (JP) | 2015-217012 |
| Nov. 12, 2015 | (JP) | 2015-222242 |
| Nov. 12, 2015 | (JP) | 2015-222243 |
| Nov. 12, 2015 | (JP) | 2015-222246 |

(51) Int. Cl.

| B62D 5/04 | (2006.01) |
|---|---|
| G01R 1/20 | (2006.01) |
| H01L 23/498 | (2006.01) |
| H01L 49/02 | (2006.01) |
| H01L 25/07 | (2006.01) |
| H01L 23/00 | (2006.01) |
| H01L 23/12 | (2006.01) |
| H01L 23/36 | (2006.01) |
| H01L 23/50 | (2006.01) |
| H01L 23/48 | (2006.01) |
| H05K 1/18 | (2006.01) |
| H05K 3/20 | (2006.01) |

(52) U.S. Cl.
CPC ............ *H01L 23/12* (2013.01); *H01L 23/36* (2013.01); *H01L 23/48* (2013.01); *H01L 23/49524* (2013.01); *H01L 23/49531* (2013.01); *H01L 23/49537* (2013.01); *H01L 23/49558* (2013.01); *H01L 23/49861* (2013.01); *H01L 23/50* (2013.01); *H01L 24/34* (2013.01); *H01L 24/37* (2013.01); *H01L 25/071* (2013.01); *H01L 28/20* (2013.01); *H02K 11/33* (2016.01); *H01L 2224/34* (2013.01); *H01L 2224/37147* (2013.01); *H01L 2224/37599* (2013.01); *H05K 1/181* (2013.01); *H05K 3/202* (2013.01); *H05K 2201/09881* (2013.01)

(56) References Cited

U.S. PATENT DOCUMENTS

| 2012/0001311 A1 | 1/2012 | Nishino et al. | |
|---|---|---|---|
| 2015/0270199 A1* | 9/2015 | Sunaga | H01L 24/37 257/288 |
| 2017/0294374 A1* | 10/2017 | Simakawa | H01L 23/50 |
| 2017/0309555 A1* | 10/2017 | Shimakawa | H01L 23/49568 |

FOREIGN PATENT DOCUMENTS

| EP | 1909324 A1 | 4/2008 | |
|---|---|---|---|
| EP | 1986479 A2 | 10/2008 | |
| JP | 07169907 A | 7/1995 | |
| JP | H07-191059 A | 7/1995 | |
| JP | 2003-133497 A | 5/2003 | |
| JP | 2004-221160 A | 8/2004 | |
| JP | 2004221260 A * | 8/2004 | H01L 24/04 |
| JP | 2006032703 A | 2/2006 | |
| JP | 2006-324542 A | 11/2006 | |
| JP | 3855306 B2 | 12/2006 | |
| JP | 2006332449 A | 12/2006 | |
| JP | 2007-214246 A | 8/2007 | |
| JP | 2007-294506 A | 11/2007 | |
| JP | 2008-198687 A | 8/2008 | |
| JP | 2008-275418 A | 11/2008 | |
| JP | 2009-194277 A | 8/2009 | |
| JP | 2009-266872 A | 11/2009 | |
| JP | 2010-016122 A | 1/2010 | |
| JP | 2011086811 A | 4/2011 | |
| JP | 2011-181650 A | 9/2011 | |
| JP | 2012-64677 A | 3/2012 | |
| JP | 2013-125848 A | 6/2013 | |
| JP | 2013-534803 A | 9/2013 | |
| JP | 2014-072316 A | 4/2014 | |
| JP | 2014-078658 A | 5/2014 | |
| JP | 2014-93498 A | 5/2014 | |
| JP | 2014-165486 A | 9/2014 | |
| JP | 2014165486 A * | 9/2014 | H01L 24/19 |
| JP | 2014179648 A | 9/2014 | |
| JP | 6191785 B2 | 9/2017 | |
| WO | 2009/110376 A1 | 9/2009 | |
| WO | 2014/068937 A1 | 5/2014 | |

* cited by examiner ns, an interaction between the wiring patterns such as impedance and inductance characteristics produced by the wiring pattern is also needed to take into account.

Hence, for example, Japanese Patent No. 3855306 B2 (Patent Document 1), Japanese Unexamined Patent Publication No. 2014-72316 A (Patent Document 2), Japanese Unexamined Patent Publication No. 2013-125848 A (Patent Document 3) and WO 2009/110376 A1 (Patent Document 4) disclose techniques to solve the above conventional problems.

The technique disclosed in Patent Document 1 relates to an electronic part mounting heat-dissipating substrate. The electronic part mounting heat-dissipating substrate comprises a metal plate which is punched in a predetermined wiring pattern shape, and a composite insulating material which is integrally molded with the metal plate and has a high heat conductivity. This technique adopts a structure in which at least a part mounting portion of the metal plate is exposed from the composite insulating material, and a heat-generating part arrangement portion of the part mounting portion is provided with a step-processed portion. Further, Patent Document 1 discloses that the step-processed portion of the electronic part mounting heat-dissipating substrate makes thin the composite insulating material formed at a lower portion of the heat-generating part arrangement portion, the heat is dispersed by a metal plate and is dissipated by an insulating material of the high heat conductivity as a result, and therefore the heat dissipation becomes good.

Further, the technique disclosed in Patent Document 2 discloses a configuration where, when a power module which drives an electric motor is formed, a pair of upper and lower switching elements are disposed adjacent to a power block and a ground block inside the power module, a power terminal connected to a power supply, a ground terminal connected to a ground and control terminals of a pair of switching elements are disposed apart from each other. Furthermore, Patent Document 2 discloses that, according to the technique disclosed in Patent Document 2, the control terminals, the power terminals and the ground terminals are disposed apart from each other as described above, so that it is possible to realize the power module which can reduce a loss and a noise.

Moreover, an object disclosed in Patent Document 3 is to solve a problem that miniaturizing a size of the power module to miniaturize a package case of a power device for which a silicon-carbide device is used narrows an inter-terminal distance and is likely to cause a discharge phenomenon between terminals. Further, to solve the problem, Patent Document 3 discloses a power module semiconductor device which comprises "a substrate, a low voltage-side gate terminal electrode which is disposed on a first side of the substrate, a low voltage-side source terminal electrode which is disposed on the first side, and is disposed adjacent to the low voltage-side gate terminal electrode, a high voltage-side gate terminal which is disposed on the first side, and is disposed apart from the low voltage-side gate terminal electrode and the low voltage-side source terminal electrode, a high voltage-side source terminal electrode which is disposed on the first side, and is disposed adjacent to the high voltage-side gate terminal electrode, an output terminal electrode which is disposed on a second side different from the first side of the substrate, a power voltage supply terminal electrode which is disposed on a third side of the substrate different from the first side and the second side, and a ground potential electrode which is disposed on the third side and is disposed apart from the power voltage

ELECTRONIC PART MOUNTING HEAT-DISSIPATING SUBSTRATE

CROSS REFERENCE TO RELATED APPLICATIONS

This application is a National Stage of International Application No. PCT/JP2015/082704, filed Nov. 20, 2015, claiming priorities based on Japanese Patent Application Nos. 2014-235691, filed Nov. 20, 2014, 2015-140106, filed Jul. 14, 2015, 2015-216153, 2015-216154, 2015-216155 and 2015-216156, filed Nov. 2, 2015 respectively, 2015-216396 and 2015-217012, filed Nov. 4, 2015 respectively, 2015-222242, 2015-222243 and 2015-222246, filed Nov. 12, 2015 respectively, the contents of all of which are incorporated herein by reference in their entirety.

TECHNICAL FIELD

The present invention relates to a substrate which reduces a wiring resistance and improves a heat dissipation and on which electronic parts are mounted or equipped. More particularly, the present invention relates to an electronic part mounting heat-dissipating substrate in which insulating members are filled by punching between lead frames of a conductor plate formed in the lead frames of circuit pattern shapes on which the electronic parts are mounted, and which is formed in a planar shape as a whole.

BACKGROUND ART

In recent years, for example, in an electronic device such as an electric power steering apparatus used for a vehicle, a power circuit for which a so-called power semiconductor or the like is used or an electronic circuit such as an inverter circuit in which a large power is used is formed as a power substrate on which these power semiconductors are collectively formed to meet a demand for miniaturization of the electronic devices including the electronic circuit. An electronic circuit in which the large power is used and an electronic circuit in which a small power is used are used as separated substrates and converted into dedicated substrates.

Further, it is an important problem to efficiently dissipate heat generated due to a loss of the highly density mounted power semiconductor to convert the circuits for which the power semiconductors are used into the dedicated substrates.

Conventionally, for such a dedicated substrate (a power substrate), a substrate formed by pasting a conductor foil (made of copper) on a surface of a metal supporting plate made of a material such as aluminum with an insulating layer interposed therebetween, etching this conductor foil and forming wiring patterns is used. The power semiconductor and various electronic parts are mounted on the substrate to forma circuit.

However, according to the above configuration, the wiring patterns are formed by etching. Therefore, when the thin conductor foil which is approximately 70 [μm] is used, and is used for a circuit for which the power semiconductor in which a large current flows is used, a wiring resistance causes a problem. Further, according to the above configuration, a heat dissipation characteristic is limited by the insulating layer of a low heat transfer coefficient. Therefore, there is a problem that it is not possible to provide a sufficient performance.

Further, when the electronic parts such as the power semiconductor are collectively mounted on the wiring patsupply terminal electrode". Patent Document 3 discloses that it is possible to lead the terminal electrode of the power module semiconductor device from three directions of the mold package and secure an insulating distance.

Still further, Patent Document 4 discloses a technique related to a lead frame substrate. The lead frame substrate comprises plural independent patterns which retain the electronic parts, and resin bonding members which are filled in gaps between the adjacent patterns to mutually connect the adjacent patterns. The resin bonding members protrude closer to a thickness direction than a top surface position of the patterns is. A back surface of the substrate is provided with a metal base plate and a metal cooling fin with a thermal conductive resin sheet interposed therebetween.

THE LIST OF PRIOR ART DOCUMENT

Patent Documents

Patent Document 1: Japanese Patent No. 3855306 B2
Patent Document 2: Japanese Unexamined Patent Publication No. 2014-72316 A
Patent Document 3: Japanese Unexamined Patent Publication No. 2013-125848 A
Patent Document 4: WO 2009/110376 A1

SUMMARY OF THE INVENTION

Problems to be Solved by the Invention

The technique disclosed in Patent Document 1 comprises the metal plate punched in the predetermined wiring pattern shape, and a highly heat conductive composite insulating material integrally molded with the metal plate. However, the metal plate portion is covered by the composite insulating material, and only the part mounting portions of the metal plate are exposed from the composite insulating materials in the structure. Thus, the structure has a problem that the heat is not sufficiently dissipated from the entire substrate including the metal plate portion to external environment, and is accumulated in the composite insulating materials.

Further, the techniques disclosed in Patent Documents 2 and 3 adopt methods for mounting or forming a circuit including the switching elements or the power device element on the lead frames, and solder-bonding the circuit or the power device element and the lead frame by wires or connecting the circuit or the power device element and the lead frames to a bus bar by the wire bonding.

However, the substrate on which the circuit of Patent Document 2 is mounted is a general substrate provided with an insulating layer in a lower layer on which the wiring pattern is formed similar to the substrate disclosed in Patent Document 1. Therefore, this substrate has a problem of the heat accumulation similar to Patent Document 1. Further, the technique disclosed in Patent Document 3 forms the element for composing the power module by using a package of a transfer mold. Therefore, this technique also has a problem of the heat accumulation similar to Patent Documents 1 and 2.

Furthermore, the technique disclosed in Patent Document 4 comprises plural independent patterns which hold the electronic parts, and the resin bonding members which are filled in gaps between the adjacent patterns to mutually connect the adjacent patterns. However, since the resin bonding members protrude closer to the thickness direction than the top surface position of the patterns, the degree of freedom of the part arrangement is limited. Further, since the lead frames have the same thickness, when the lead frames are processed in predetermined patterns by pressing, it is generally necessary to provide a certain distance (gap) corresponding to the thickness between the lead frames. Therefore, improving a wiring density of the lead frames is limited. Still further, according to the technique disclosed in Patent Document 4, it is necessary to lay wires between the parts by the wire bonding which is another process after the parts are mounted on the substrate.

It is therefore an object of the present invention to solve the above problems, and the object is to provide an electronic part mounting heat-dissipating substrate which enables a circuit for which a power semiconductor in which a large current flows is used to reduce the wiring resistances of a large power operation and improve the heat dissipation.

Means for Solving the Problems

In order to solve the above problems, the present invention provides an electronic part mounting heat-dissipating substrate which comprises: a conductor plate which is formed on lead frames of wiring pattern shapes; and an insulating member which is provided between the lead frames of the wiring pattern shapes on the conductor plate; wherein a plate surface of a part arrangement surface of the conductor plate and a top surface of the insulating member at a side of the part arrangement surface form one continuous surface, wherein a plate surface of a back surface of the part arrangement surface of the conductor plate and a top surface of the insulating member at a side of the back surface at the part arrangement surface-side are formed in an identical plane, wherein the part arrangement surface is provided on both surfaces of the electronic part mounting heat-dissipating substrate, a reductant circuit which includes at least similar dual-system circuit is formed on the electronic part mounting heat-dissipating substrate, a first-system circuit of the dual-system circuit is formed on a first surface of the electronic part mounting heat-dissipating substrate, a second-system circuit of the dual-system circuit is formed on a second surface of the electronic part mounting heat-dissipating substrate, and the common lead frames which are commonly used in a portion of a circuit wiring are used to the first surface and the second surface of the electronic part mounting heat-dissipating substrate.

Further, the above-object is more effectively achieved by that: wherein the reductant circuit is an inverter circuit of an electric motor, and the dual-system circuit is provided with respective phases of the inverter circuit.

The above-object of the present invention is more effectively achieved by that: wherein the lead frames of the wiring pattern shapes have different thicknesses of at least two types or more, and the thick lead frame is used for a large current signal and the thin lead frame is used for a small current signal; or wherein the lead frames of the different thicknesses are provided in a mixed arrangement; or wherein the plate surface of the back surface of the part arrangement surface of the lead frames of the wiring pattern shape, and the top surface of the insulating member at the back surface-side at the part arrangement surface-side are formed in an identical plane to meet the plate surface of the back surface of the part arrangement surface of the thickest lead frame among the lead frames.

The above-object of the present invention is more effectively achieved by that: wherein a portion of the plate surface of the part arrangement surface at which the part is not disposed on the plate surface of the part arrangement surface of the lead frames is provided with a top surface side recess portion, and is covered by the insulating member, and the top surface of the insulating member which covers the top surface-side recess portion, and the plate surface of the part arrangement surface of the lead frames and the top surface at the part arrangement surface-side of the insulating member form one continuous surface; or wherein a portion corresponding to a back surface of the part arrangement surface at which the part is not disposed on the plate surface of the back surface of the part arrangement surface of the lead frame is provided with a back surface-side recess portion, and is covered by the insulating member, and the top surface of the insulating member which covers the back surface-side recess portion, and the plate surface of the back surface of the part arrangement surface of the lead frames and the top surface of the insulating member at the back surface-side at the part arrangement surface-side form one continuous surface.

Further, the above-object of the present invention is more effectively achieved by that: wherein engagement portions are provided from a side of a surface-side of the lead frames to a side of the insulating member and between the lead frames of the wiring pattern shapes and the insulating member, and the engagement portions are steps formed at sides of a top surface and a back surface of a surface-side of the lead frames and between the lead frames and the insulating member; or wherein a portion of the lead frames of the wiring pattern shapes formed by the conductor plate has a shape which is bent upward or downward with respect to a plate surface of the conductor plate and at a side closer to an inner side or an outer side than a periphery of the insulating member.

Furthermore, the above-object of the present invention is more effectively achieved by that: wherein all or a portion of the lead frames of the wiring pattern shapes formed by the conductor plate, is bendably formed at an outward of a periphery of the insulating member; or wherein all or a portion of the lead frames of the wiring pattern shapes formed by the conductor plate, abuts a heat conductor at an outward of a periphery of the insulating member.

The above-object of the present invention is effectively achieved by that: a power module of an electric power steering apparatus for which the electronic part mounting heat-dissipating substrate, wherein the thick lead frame is used for a large current signal of the power module, and the thin lead frame is used for a small current signal of the power module.

The above-object of the present invention is effectively achieved by that: a connection structure of a shunt resistor used for the electronic part mounting heat-dissipating substrate or the power module, wherein the electronic part mounting heat-dissipating substrate includes two connection portions which connect two terminals of the shunt resistor on the thick lead frames, one end of the thin lead frame is disposed near the two connection portions, or one end of the thin lead frames is disposed at cutout portions formed at part of the two connection portions, and the two terminals of the shunt resistor are connected by placing the two terminals of the shunt resistor on the two connection portions.

The above-object of the present invention is effectively achieved by that: a method for forming the thin lead frames on a part arrangement surface of both surfaces of the electronic part mounting heat-dissipating substrate, comprising: forming the thin lead frames more or less shifted without completely overlapping when the back surface is seen in a transparent state from the top surface, wherein, when the substrate is fit into the mold which are composed of an upper die and a lower die in order that the insulating member is filled between the lead frames, by utilizing the thin lead frames more or less shifted without completely overlapping when the back surface is seen in a transparent state from the top surface, the thin lead frames of the back surface side are held by downward pins which are downwardly protruded from the upper die, the thin lead frames of the top surface side are held by upward pins which are upwardly protruded from the lower die, the insulating member is filled between the lead frames, and the thin lead frames are fixed on the part arrangement surface of both surfaces of the electronic part mounting heat-dissipating substrate.

Further, the above-object of the present invention is effectively achieved by an electric power steering apparatus for which the electronic part mounting heat-dissipating substrate, or the electric power steering apparatus comprising the connection structure of the shunt resistor.

Effects of the Invention

According to an electronic part mounting heat-dissipating substrate according to the present invention, lead frames of wiring pattern shapes of a circuit on which electronic parts are mounted are formed by a method for punching by press-working or laser-processing a conductor plate made by using metal such as aluminum or copper. Further, the gap between the lead frames is entirely fixed by a heat conductive resin or the like. Consequently, according to the configuration, it is not necessary to provide a special step-processed portion at a heat-generating electronic part mounted/equipped portion.

Thus, according to the electronic part mounting heat-dissipating substrate of the present invention, the electronic parts such as the power semiconductor can be directly solder-bonded on the lead frames of the wiring pattern shapes composed of the conductor plate to compose a circuit. Further, the larger plate thickness can also be secured for the conductor plate which forms the lead frames. In this way, even when the electronic part mounting heat-dissipating substrate is used for a circuit in which a large current flows, it is possible to reduce a circuit wiring resistance and effectively suppress a heat generation amount. In addition, it is possible to suppress a temperature rise which is a transient phenomenon such as a sudden heat generation caused when a large current flows to the power device to support sudden steering in an electric power steering apparatus.

That is, as illustrated in, for example, FIG. 22A, a conventional aluminum substrate 2100 is formed by forming an insulating layer on an upper surface of an aluminum layer, and mounting electronic parts EC such as FETs and a capacitor on patterning wires such as a copper foil layer formed on an upper layer of the insulating layer. A lower surface of the aluminum layer is disposed in a case with a TIM (Thermal Interface Material) described below interposed therebetween. By contrast with this, a substrate 2200 according to the present invention illustrated in FIG. 22B is composed of lead frames 110 and insulating members 130. The respective electronic parts EC can be directly mounted on the lead frames 110 by the SMT (Surface Mount Technology), and can be manufactured by a conventional reflow device. Further, adopting such a structure results in improving a transient heat characteristic since the substrate according to the present invention differs from the conventional aluminum substrate in an insulating layer which is the TIM and the lead frames which are heat spreaders. Furthermore, when this substrate according to the present invention is used, and is connected with another control substrate, it is possible to remove custom parts (terminal terminals) and reduce the cost. Still further, upon comparison between the present invention and a conventional transfer module, a high-capacity electrolytic capacitor can be mounted on the substrate according to the present invention. Consequently, it is also possible to provide advantages that electric characteristics improve and another substrate does not need to be provided for the high-capacity electrolytic capacitor.

Further, the heat generated by the electronic parts mounted on the substrate according to the present invention is dissipated by the conductor plate composing the substrate and the insulating member. Then, when necessary, this heat can be dissipated to an external thermal mass through the composite insulating material for which a highly heat conductive heat-conductive material (TIM (Thermal Interface Material)) of a housing of a control unit in which the substrate is housed is used. Thus, a synergy effect provided by the housing of the control unit in which the substrate is housed can further improve the heat dissipation.

Furthermore, the insulating member according to the present invention is made of the highly heat conductive composite-insulating material, and the insulating layer formed between the lead frames of the circuit pattern shapes can be formed thick. Accordingly, it is possible to provide an effect that it is possible to reduce a distribution capacitance such as a capacitor between patterns.

According to the present invention, both surfaces of the electronic part mounting heat-dissipating substrate are used as the part arrangement surface, and the reductant circuits are disposed and formed on the both surfaces of the electronic part mounting heat-dissipating substrate. In a case of using the common lead frames which are used in the common circuit wiring of the reductant circuits which are disposed on the both surfaces, since the maximum current amount which are used in one system decrease up to about 50%, a miniaturization of the electronic parts such as an FET is possible. In a case of using the inverter of the three-phase brushless motor in the electric power steering apparatus, a structure of a partial reductant system is possible. If needed, by using (cross driving) the combination of the first surface and the second surface of the reductant circuits which are mounted both surfaces and are configured to the above three-phase, it is possible to improve fault tolerance.

BRIEF DESCRIPTION OF THE DRAWINGS

In the accompanying drawings:

FIG. 4A is a top view and FIG. 4B is a side view;

FIG. 10A is a perspective view illustrating a state of the lead frames in which insulating members are not yet filled, and FIG. 10B is a perspective view illustrating a state of the substrate in which the insulating members have been filled;

FIG. 11A is a top view of this example, FIG. 11B is a side view illustrating that the lead frames having the same thickness are used for the substrate, and FIG. 11C is a side view illustrating that the lead frames having the different thicknesses are used for the substrate;

FIG. 19A is a circuit diagram illustrating the reductant circuit of a W-phase part in the three-phase as shown in FIG. 18, and FIG. 19B is a side sectional view illustrating a particular example where the lead frames are commonly used in the W-phase part and the circuit wiring part in the electronic part mounting heat-dissipating substrate according to the present invention;

FIG. 20A is a perspective view illustrating a configuration where the shunt resistor is not yet connected to the electronic part mounting heat-dissipating substrate according to the present invention, and FIG. 20B is a perspective view illustrating a configuration where the shunt resistor has been connected to the substrate;

FIG. 21A is a perspective view illustrating a configuration where the shunt resistor is not yet connected to the electronic part mounting heat-dissipating substrate according to the present invention, and FIG. 21B is a perspective view illustrating a configuration where the shunt resistor has been connected to the substrate;

MODE FOR CARRYING OUT THE INVENTION

An embodiment of the present invention will be described by using a case where is used for a control unit (ECU) of an electric power steering apparatus mounted on a vehicle as an example.

In this regard, the electric power steering apparatus (EPS) applies a rotational force of an electric motor as a steering assist force (an assist force) to a steering mechanism of the vehicle, and applies a driving force of the motor as the steering assist force to a steering shaft or a rack shaft with a transmission mechanism such as gears and a belt via a reduction mechanism. Further, such the electric power steering apparatus accurately generates a torque of the steering assist force and therefore performs a feedback control of a motor current.

The above feedback control is a control to adjust a motor applying voltage in order to decrease a difference between a steering assist command value (a current command value) and a motor current detection value. The motor applying voltage is generally controlled by adjusting a duty of a pulse width modulation (PWM)-control.

Figure 1:
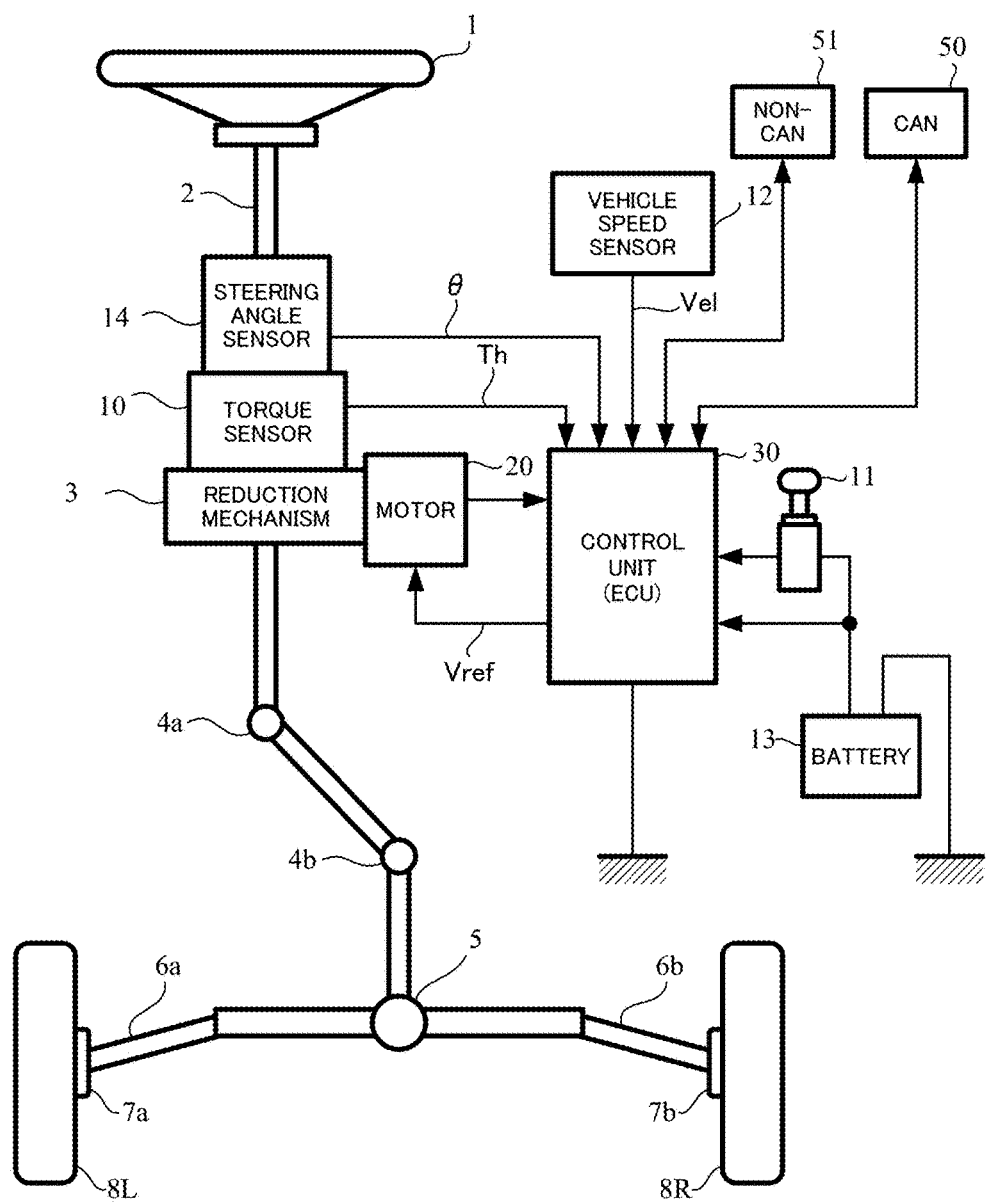
FIG. 1 is a configuration diagram illustrating a general configuration of an electric power steering apparatus.

A general configuration of the electric power steering apparatus will be described with reference to FIG. 1. A column shaft (a steering shaft and a handle shaft) 2 of a handle 1 is coupled to steered wheels 8L and 8R via reduction gears of a reduction mechanism 3, universal joints 4a and 4b, a pinion and rack mechanism 5, and tie rods 6a and 6b, and via hub units 7a and 7b. Further, the column shaft 2 is provided with a torque sensor 10 to detect a steering torque Th of the handle 1 and a steering angle sensor 14 to detect a steering angle θ. A motor 20 to assist a steering force of the handle 1 is coupled to the column shaft 2 via the reduction gears (a gear ratio n) of the reduction mechanism 3.

Further, a control unit (ECU) which is a control unit 30 to control the electric power steering apparatus comprises a micro controller unit (MCU) as a key part, receives power supply from a battery 13 and receives an input of an ignition key signal via an ignition key 11.

The control unit 30 configured as described-above performs a calculating operation on a current command value of an assist (a steering assist) command based on the steering torque Th detected by the torque sensor 10 and the vehicle speed Vel detected by the vehicle speed sensor 12, and controls a current supplied to the electric motor 20 in accordance with a voltage control command value Vref obtained by compensating for the current command value. As well, the steering angle sensor 14 is not indispensable, and may not be disposed, and a steering angle may be obtained from a rotational position sensor such as a resolver coupled to the motor 20.

Further, the control unit 30 is connected with a CAN (Controller Area Network) 50 which receives various pieces of information of the vehicle, and can receive the vehicle speed Vel from the CAN 50. Furthermore, the control unit 30 is connected with anon-CAN 51, too, which performs a communication with components other than the CAN 50, and receives analog/digital signals and radio waves.

Figure 2:
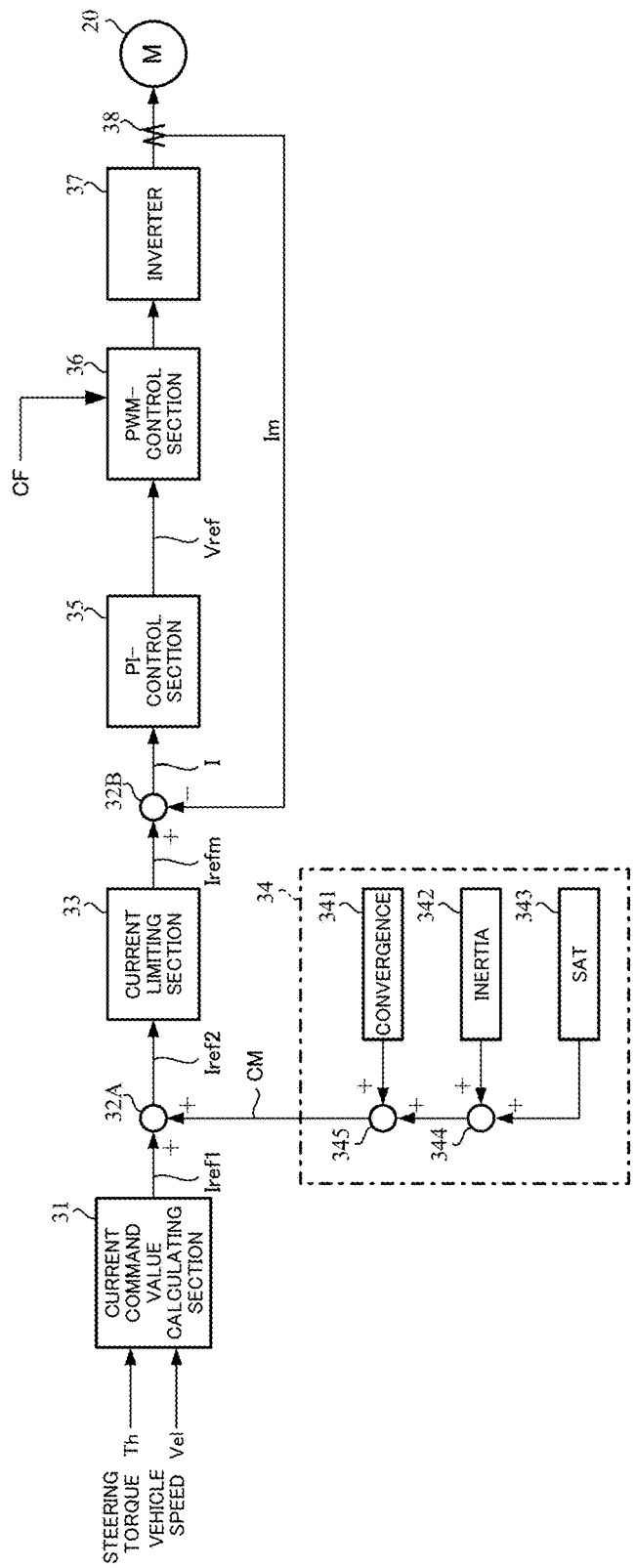
FIG. 2 is a block diagram illustrating a general function of a control unit in the electric power steering apparatus.

General functions performed by programs within the above MCU of the above control unit 30 are shown in FIG. 2.

As shown in FIG. 2, the steering torque Th detected by the torque sensor 10 and the vehicle speed Vel detected by the vehicle speed sensor 12 are inputted into a current command value calculating section 31. The current command value calculating section 31 calculates a current command value Iref1, based on the steering torque Th and the vehicle speed Vel with reference to an assist map and so on. The calculated current command value Iref1 is added a compensation signal CM from a compensation section 34 for improving a characteristic, and an added current command value Iref2 is limited to the maximum value at the current limiting section 33. A current command value Irefm, of which the maximum value is limited, is inputted into a subtracting section 32B and a motor current detecting value Im is subtracted from the current command value Irefm.

The subtracted result I (=Irefm−Im) at the subtracting section 32B is PI (Proportional-Integral)-controlled at a PI-control section 35. The PI-controlled voltage control value Vref is inputted into a PWM-control section 36 with a modulation signal (carrier) CF, and a duty is calculated at the PWM-control section 36. The duty-calculated PWM signal PWM-drives the motor 20 via an inverter 37. The motor current value Im of the motor 20 is detected by a motor current detecting means 38 and is fed-back to the subtracting section 32B.

The compensation section 34 first adds a detected or estimated self-aligning torque (SAT) to an inertia compensation value 342 at an adding section 344, the added result is added to a convergence control value 341 via the adding section 345. The above added result is inputted into the adding section 32A as the compensation signal CM to improve the characteristic.

Figure 3:
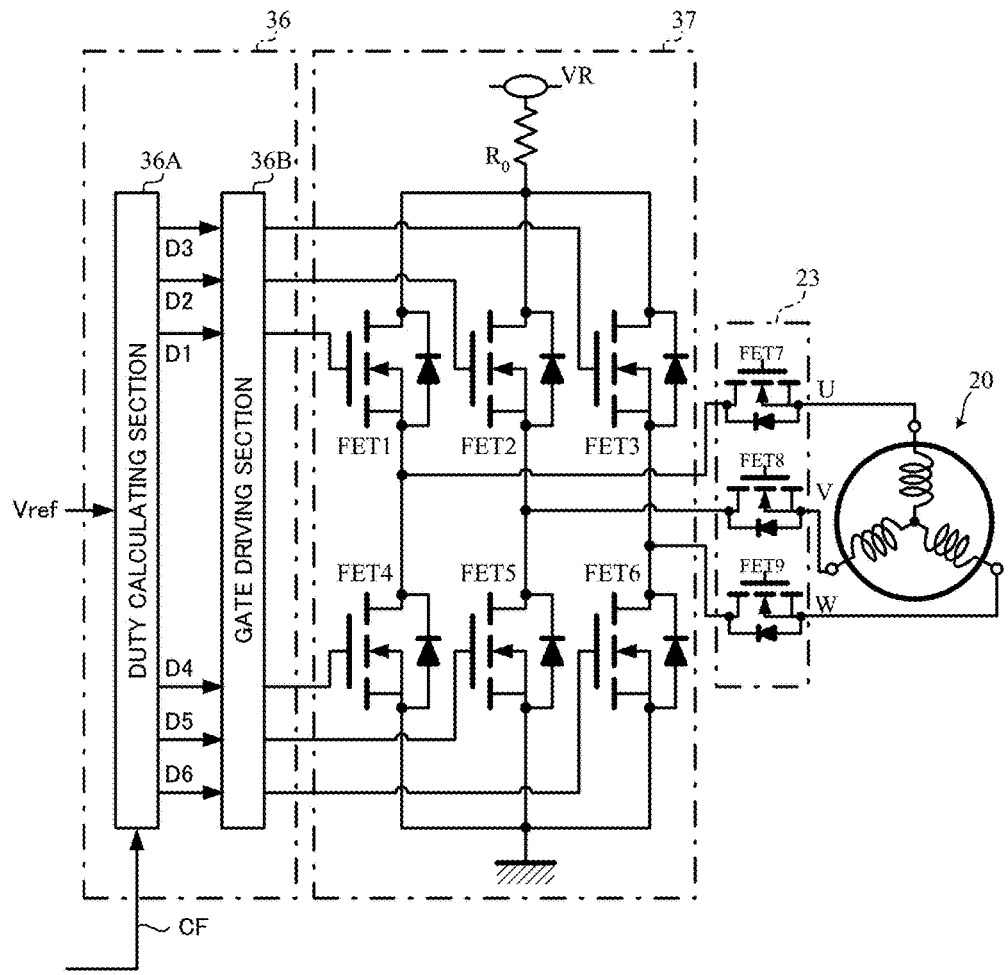
FIG. 3 is a diagram illustrating an outline of a PWM-control section and a configuration example of an inverter circuit.

Further, in a case that the above motor 20 is a three-phase brushless motor, details of the PWM-control section 36 and the inverter 37 are shown in, for example, a configuration of FIG. 3. The PWM-control section 36 comprises a duty calculating section 36A to calculate three-phase PWM-duty values D1 to D6 from the voltage control value Vref in accordance with a predetermined equation, and a gate driving section 36B to drive gates of FETs serving as driving elements by using the PWM-duty values D1 to D6 and switches-ON or switches-OFF for compensating a dead time. The modulation signal (carrier) CF is inputted into the duty calculating section 36A, and the duty calculating section 36A calculates the PWM-duty values D1 to D6 in synchronous with the modulation signal CF.

Furthermore, the inverter 37 comprises a three phase bridge that has a first up-down arm which includes an upper FET1 and a lower FET4 of U-phase, a second up-down arm which includes an upper FET2 and a lower FET5 of V-phase and a third up-down arm which includes an upper FET3 and a lower FET6 of W-phase. The above respective FETs drive the motor 20 by switching-ON or switching-OFF based on the PWM-duty values D1 to D6.

As well, a motor release switch 23 to block the current supply at an assist control stopping time or the like is interposed between the inverter 37 and the motor 20. The motor release switch 23 comprises FET7 to FET9 which are interposed for the respective phases, and each of the FET7 to the FET9 has a parasitic diode.

Then, an electronic part mounting heat-dissipating substrate according to the present invention provided inside the control unit 30 in the electric power steering apparatus configured as described above, is configured as follows. In this connection, the same components which can adopt other modes will be assigned the same reference numerals, and overlapping descriptions and configurations will not be partially described below. Further, a size and a ratio of each component illustrated in the drawings are different from an actual size and ratio for ease of description in some cases.

Figure 4A:
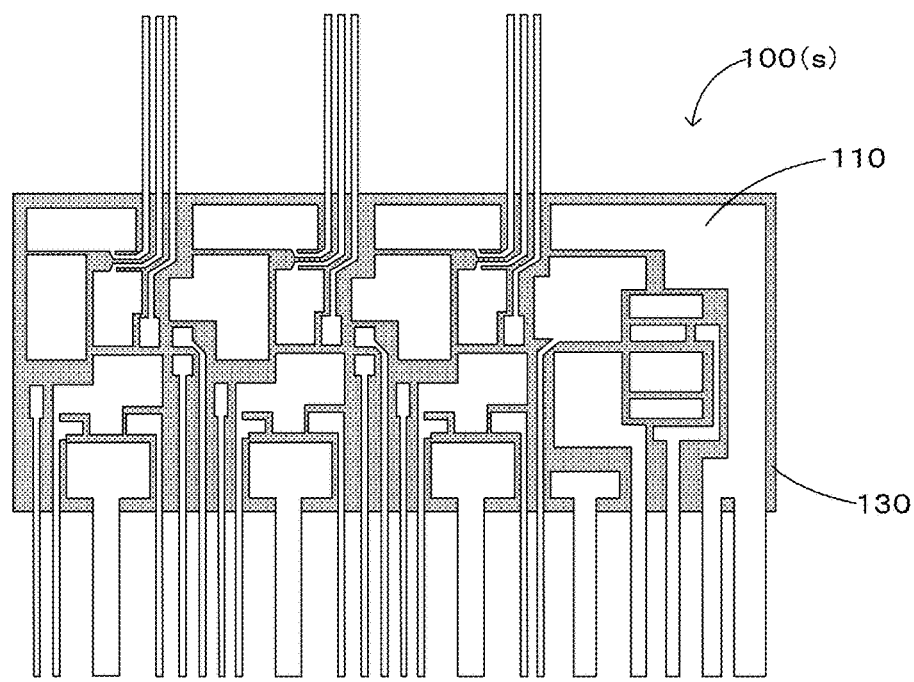
FIGS. 4A and 4B illustrate an example of an electronic part mounting heat-dissipating substrate according to the present invention.
Figure 4B:
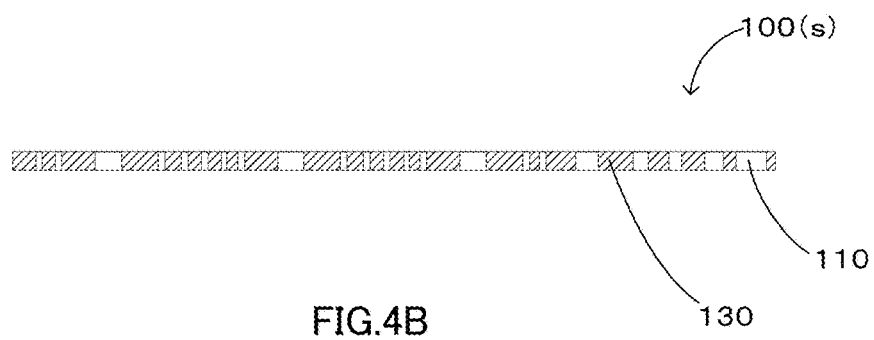

FIGS. 4A and 4B show an example of the electronic part mounting heat-dissipating substrate 100(*s*) according to the present invention, and FIG. 4A is a top view and FIG. 4B is a side view. As shown in, for example, FIGS. 4A and 4B, the electronic part mounting heat-dissipating substrate 100(*s*) according to the present invention basically comprises lead frames 110 which are formed in wiring pattern shapes by a means such as punching or the like, and insulating members 130 which are integrally molded between these lead frames 110. In this regard, portions encircled by white closed curves in FIGS. 4A and 4B indicate the lead frames 110, and gray shaded portions in FIG. 4A and diagonal portions in FIG. 4B indicate the insulating members 130.

In the electronic part mounting heat-dissipating substrate 100(*s*) according to the present invention, since the lead frames 110 are formed by using the conductor plate, the substrate 100(*s*) is formed in a flat plate shape as a whole and is formed in wiring pattern shapes of a circuit on which the electronic parts are mounted when seen from an upper surface-side. Further, molding means for the lead frames 110 of the wiring pattern shapes of the conductor plate is not limited in particular. For example, it is possible to adopt a plate member or the like made of metal (made of aluminum or copper, for example) process-cut by a press-working, a punch-working or a laser-processing.

Further, it is also possible to perform the above molding by etching. However, the present invention increases the thickness of the lead frames 110 formed by using the conductor plate by increasing a plate thickness of the conductor plate and decreases a wiring resistance. Hence, even when the processing is performed by the above etching, and if the material is copper, by forming at least the thickness of approximately 70 [μm] or more, the heat dissipation characteristic is improved compared to a substrate on which circuit patterns are formed by the conventional etching. Further, when the processing is not performed by the above etching and the lead frames 110 of the wiring pattern shapes are formed by the press-working or the punch-working, if, for example, the copper is used, the plate thickness of the conductor plate is at least more desirably 300 [μm] or more.

Furthermore, according to the present invention, it is possible to arbitrarily set the plate thickness of the conductor plate. Consequently, it is possible to use signal lines of different thickness in which a small current flows and in which a large current flows in a mixed manner for the signal lines of the lead frames formed by using the conductor plate. In this case, it is also possible to change and process a feed bridge width of the press-working or the like corresponding to a plate thickness.

Accordingly, for the electronic parts for which a high current is used, it is possible to provide a small current lead frame 110(*l*) of a narrow line width and a large current lead frame 110(*h*) of a wide line width by adjusting the substrate surfaces to make an area larger or smaller (size of the line widths of the lead frames 110, for example). However, the present invention is not limited to this. That is, by increasing the plate thickness and then increasing a volume, it is possible to reduce the wiring resistance and improve the heat dissipation, too. As a result, it is possible to further improve the part mounting density.

Further, according to the present invention, the conductor plates having different thicknesses of at least two types or more are used. Consequently, it is also possible to form the lead frames 110 of the wiring pattern shapes having the different thickness of at least two types or more. Furthermore, in this case, the lead frames having the different thickness can be also provided in a mixed arrangement.

Therefore, when a configuration where the lead frames of the different plate thickness are used in a mixed manner, it is also possible to dispose with a high-density the lead frames which support current-amounts to be applied to the mounted electronic parts, and reduce a relevant cost by reducing a material of use and a dimension.

That is, when the lead frames are formed by, for example, the punch-working as described above, an operation which is called blanking of shaping an outline shape of lead frame wiring portions by the press-working is performed. Then, a material which is made larger than a final molded article is used for the blanking. This larger portion is called as a bridge, and the bridge includes a "feed bridge width" and an "edge bridge width". Generally, when a minimum necessary width of the bridge width is a plate thickness t [mm], the "feed bridge width" is approximately 1.0 t to 1.5 t [mm], and the "edge bridge width" is "1.5×feed bridge width". Making the bridge width too small makes it impossible to perform the normal punching, and further abrasion of punches and dies are accelerated and burrs are produced.

Figure 5A:
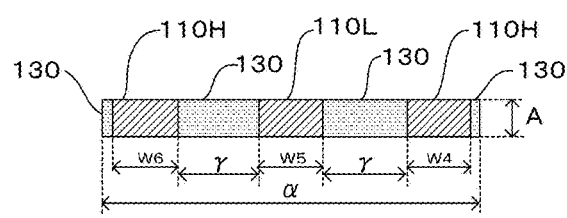
FIG. 5A is a sectional view seen from an extension direction of lead frames of the substrate according to the present invention composed of the lead frames having the same thickness.
Figure 5B:
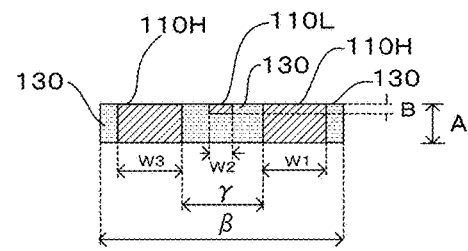
FIG. 5B is a sectional view seen from the extension direction of the lead frames of the substrate according to the present invention composed of the lead frames having different thicknesses.
Figure 5C:
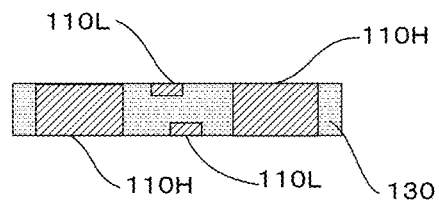
FIG. 5C is a sectional view illustrating an example where upper and lower surfaces of the substrate according to the present invention composed of the lead frames having the different thicknesses are part arrangement surfaces seen from the extension direction of the lead frames.

In this way, according to the present invention, instead of using the large current and small current (small signal) lead frames having the same plate thickness, it is also possible to use and provide plural lead frames supporting each current in a mixed manner as shown in FIGS. 5A to 5C. In this regard, FIG. 5A is a sectional view seen from an extension direction of the lead frames of the substrate according to the present invention composed of the lead frames having the same thickness. FIG. 5B is a sectional view seen from the extension direction of the lead frames of the substrate according to the present invention composed of the lead frames having the different thickness.

In a case that the lead frames 110 having the same thickness are used for two large current lines 110H (having widths W4 and W6) and small signal lines 110L (width W5) as shown in FIG. 5A, a feed bridge width γ corresponding to the thickness t (t=A, herein) of the lead frames 110 is needed for each of intervals between the lead frames 110. Hence, in an example shown in FIG. 5A, for example, a total alignment sum of the widths of the plural lead frames 110 and the feed bridge width (a portion at which a filler is filled) is approximately α ($\alpha \approx 2\gamma + W4 + W5 + W6$).

Meanwhile, FIG. 5B illustrates that the lead frames 110 having the different thickness (the thickness t of the large current lines "t=A" and the thickness t of the small current line "t=B") are used for the two large current lines 110H (having widths W1 and W3) and small signal lines 110L (width W2). In this case, mutual intervals between plural lead frames allow the small current lines 110L to be disposed between the large current lines 110H. Consequently, a total alignment sum of the widths of the plural lead frames 110 and the feed bridge width (the portion at which the filler is filled) is approximately β ($\beta \approx \gamma + W1 + W3$).

Hence, as a result obtained by employing the above configuration, when the widths of the plural lead frames 110 and a lead edge member are compared, a relation "α>β" is established. Thus, by making the thickness of the small signal lines 110L thinner than the thicknesses of the large current lines 110H, it is possible to increase the wiring density. Further, since the lead frames 110L for the small current lines can use a conductor plate of a thinner plate thickness, it is possible to save the materials of use and reduce the cost.

Accordingly, for example, the conductor plates for making the lead frames having plate thickness t where t=A (in this regard, A=1.0 [mm]) and t=B (in this regard, B=0.25 [mm]) hold are used. In this case, the large current lines 110H are processed by using the conductor plate having the plate thickness A, the small signal lines 110L are processed by using the conductor plate having the plate thickness B, and the large current lines 110H and the small signal lines 110L are combined and used for the substrate according to the present invention. Thus, it is possible to miniaturize the substrate.

Therefore, this configuration will be described as a more concrete example. For example, as shown in FIGS. 6A and 6B and subsequent figures, it is possible to refine the circuit mounted on the substrate, and miniaturize the substrate compared to the substrate for which the lead frames of the single thickness are used.

Figure 6A:
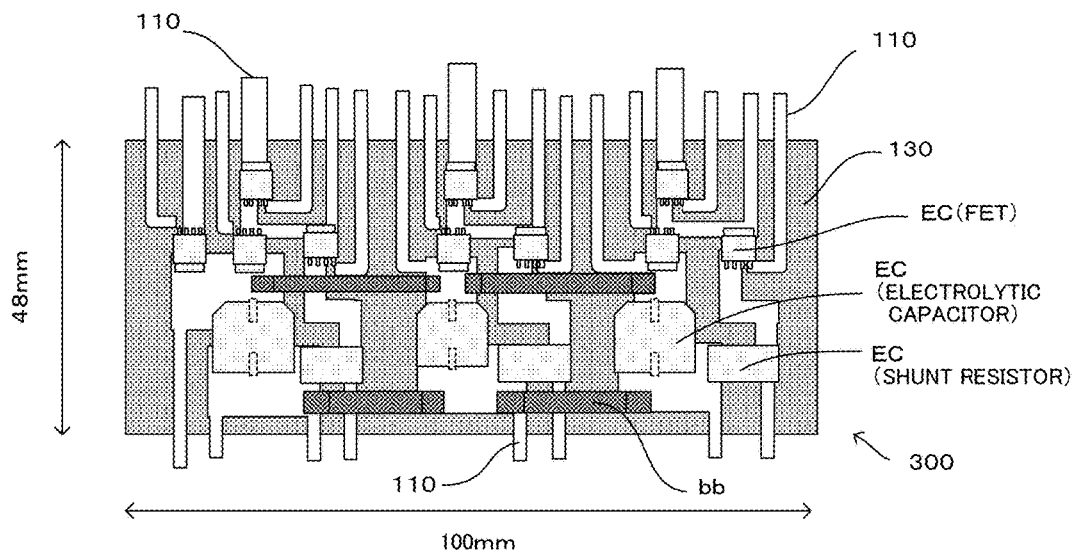
FIG. 6A is a top view illustrating that a circuit is formed on the substrate according to the present invention by using the lead frames having the thickness of a single type.

Here, FIG. 6A is a top view illustrating that a circuit is formed on an electronic part mounting heat-dissipating substrate 300 according to the present invention by using the lead frames 110 having the thickness of a single type. FIG. 6B is a top view illustrating an example where a similar circuit is formed on an electronic part mounting heat-dissipating substrate 350 according to the present invention by using two types of the lead frames 110H and 110L having different thicknesses and widths as described above.

Figure 6B:
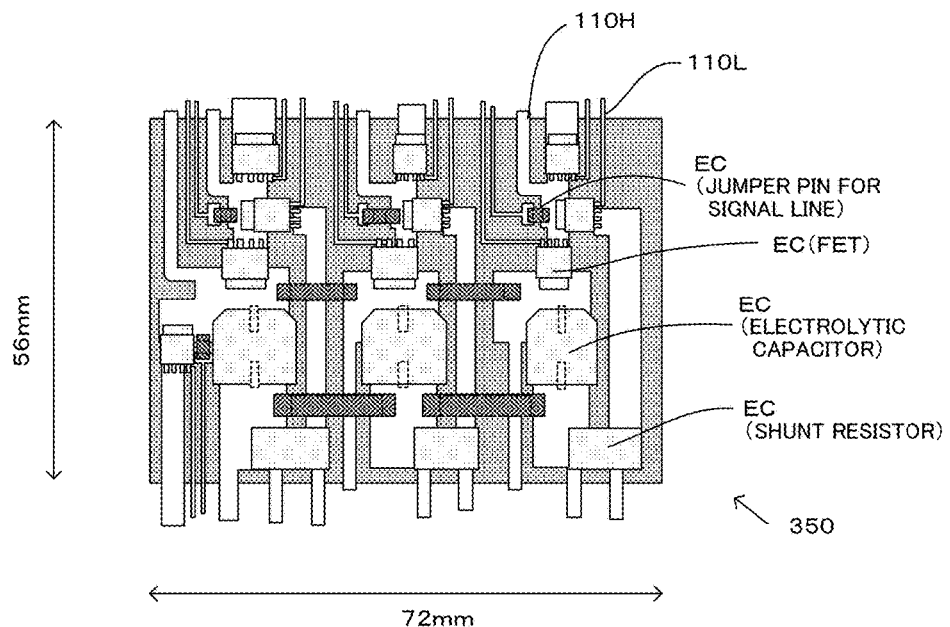
FIG. 6B is a top view illustrating an example where a similar circuit is formed on the substrate according to the present invention by using two types of the lead frames having the different thicknesses and widths.

As well, FIGS. 6A and 6B show a state where the electronic parts EC are mounted on the substrate and show examples where this circuit is an inverter circuit of a three-phase brushless motor used for the electric power steering apparatus.

Assume a case where, as shown in FIG. 6A, a wiring system such as FETs which are used for the circuit and in which a relatively large current flows and a wiring system which is used for control signals of the FETs and in which a relatively small current flows, are configured by using the lead frames 110 having the thickness of a single type (e.g. 1 [mm]). In this case, in an example where ten FETs are mounted as described above, a substrate surface area is approximately 4800 [mm$^2$].

Meanwhile, as shown in FIG. 6B, the different lead frames 110 are used. In a case that the thick (e.g. approximately 1 [mm]) large power lead frames 110H are used for the wiring system such as the FETs which are used for the circuit and in which a relatively large current flow, and the thin (e.g. approximately 0.25 [mm]) small power lead frames 110L are used for the wiring system which is used for the control signals of the FETs and in which a relatively small current flows, it is also possible to reduce the widths of the lead frames corresponding to the thicknesses of the lead frames. Consequently, it is possible to miniaturize the substrate surface area of the similar circuit to approximately 4032 [mm$^2$].

Therefore, by using the lead frames of the different thicknesses as described above, it is possible to reduce approximately 15% of the surface area of the substrate 350 in comparison with the substrate 300.

In this regard, a material of the conductor plate for forming the lead frames are formed by using relatively a low cost metal good conductors such as the copper or the aluminum described above, so that it is possible to reduce the cost. However, the conductor plates are used to form the lead frames 110 and the electronic parts are mounted thereon by soldering. Therefore, the conductors desirably have a high heat conductivity as well as have a good compatibility to mount the electronic parts.

Back to FIGS. 4A and 4B, the insulating members 130 of the electronic part mounting heat-dissipating substrate 100(*s*) according to the present invention are configured to fill spaces of the gaps between the lead frames 110 of the wiring pattern shapes formed by the conductor plates. By filling the insulating members 130 in the gaps between the lead frames, the lead frames are mutually adhered to stably keep an entire structure on a flat plate basically.

Then, when the lead frames 110 formed by the conductor plates have the same plate thickness as the embodiment 100(*s*) shown in FIGS. 4A and 4B, a side of the lead frames 110 on which the electronic parts are mounted is an upper surface-side in a front direction vertical to FIG. 4A (an upper direction in FIG. 4B). In this case, a plate surface at the upper surface-side of the lead frames 110, and the plate surfaces (the top surfaces) at an upper surface-side of the insulating members 130 are formed to form the identical plane. Further, the back surfaces of the plate surfaces formed by the lead frames 110 and the back surfaces of the insulating members 130 are also formed so as to form the identical plane likewise. In this regard, the side on which the electronic parts are mounted can be arbitrarily selected, and the electronic parts can also be configured to be mounted on both surfaces of the electronic part mounting heat-dissipating substrate 100.

Figure 7A:
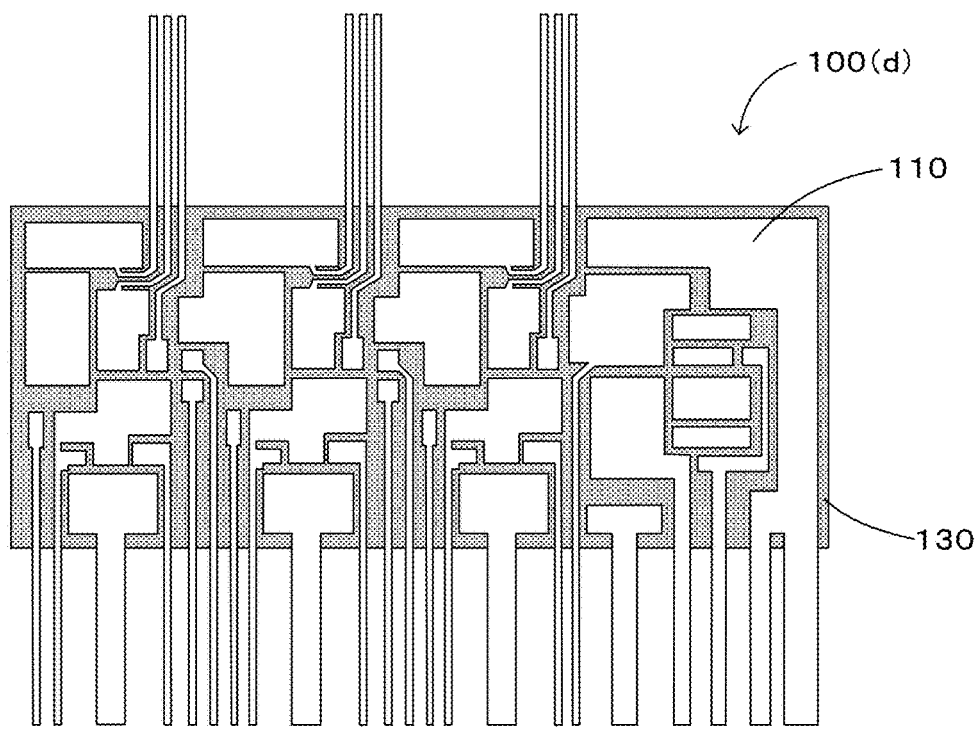
FIG. 7A is a top view illustrating that a circuit is formed on the substrate according to the present invention by using the lead frames having different thicknesses.
Figure 7B:
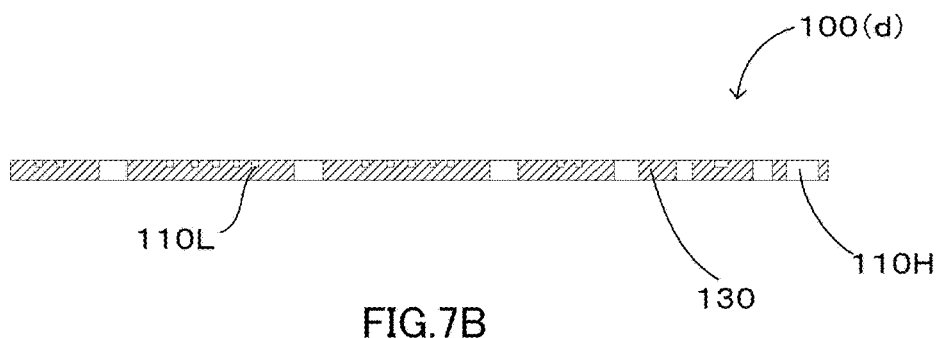
FIG. 7B is a side view of this circuit.
Figure 7C:
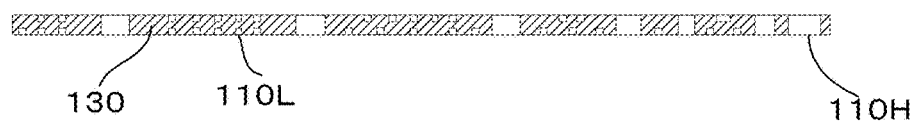
FIG. 7C is a side view illustrating an example where upper and lower surfaces of the substrate according to the present invention are part arrangement surfaces by using the lead frames having different thicknesses.

Further, assume a case where the lead frames 110 formed by the conductor plates have the different plate thicknesses as in the embodiment 100(*d*) as shown in FIGS. 7A to 7C. In this case, in similar to the embodiment 100(*s*) in FIGS. 4A and 4B, the side of the lead frames 110 on which the electronic parts are mounted is an upper surface-side in a front direction vertical to FIG. 7A (an upper direction in FIG. 7B). In this case, the plate surfaces at the upper surface-side of the lead frames 110 and the plate surfaces at the upper surface-side of the insulating members 130 are formed to form the identical plane.

On the other hand, the plate surfaces at the back surface-side opposite to the side of the lead frames 110 on which the electronic parts are mounted have the different thicknesses of the lead frames 110 as described. Therefore, the back surfaces formed by the lead frames 110 cannot form the identical plane. Hence, the plate surfaces of the back surfaces of the part arrangement surfaces of the lead frames 110 formed by the conductor plates and the plate surfaces (the top surfaces) at the back surface-side at the part arrangement surface side of the insulating members 130 are aligned to the plate surface of the back surface of the part arrangement surface of the thickest lead frame of the lead frames, and the insulating members are filled, so that the plate surface at the back surface-side of the lead frame of the largest plate thickness and the plate surfaces (the top surfaces) at the back surface-side formed by the insulating members form an identical plane. As a result, the back surface of the substrate for which the lead frames having plural thicknesses are used, forms the identical plane with the back surface of the part arrangement surface of the largest lead frame and the insulating members. Besides, the side on which the electronic parts are mounted may be arbitrarily selected. The electronic parts can also be mounted on both surfaces of the electronic part mounting heat-dissipating substrate 100(*s*) or 100(*d*) (these are collectively referred to as 100(*s, d*) or 100).

Figure 8A:
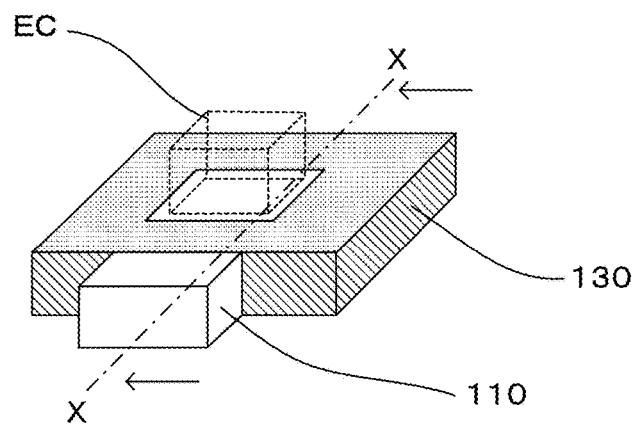
FIG. 8A is a perspective view illustrating a configuration example where a recess portion is provided to the lead frame.
Figure 8B:
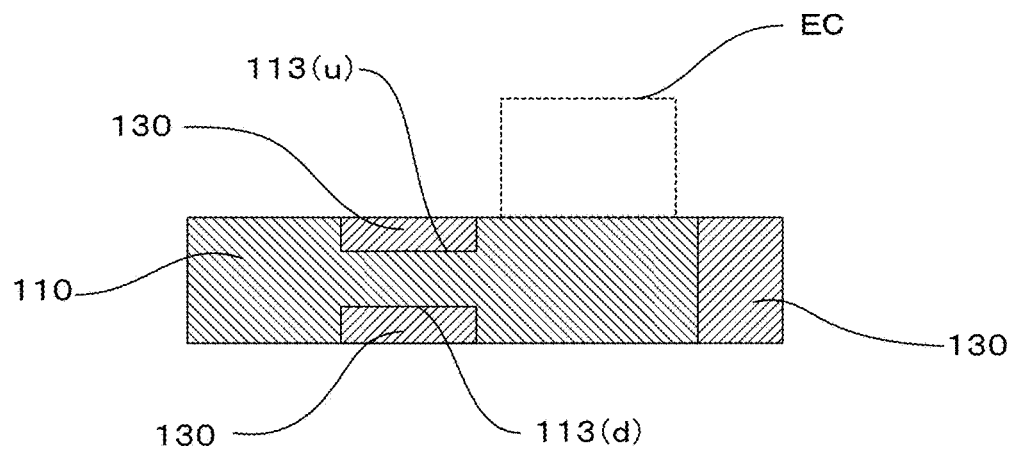
FIG. 8B is a sectional view illustrating a cross section passing a line X-X in FIG. 8A from a direction of arrows in FIG. 8A.
Figure 10A:
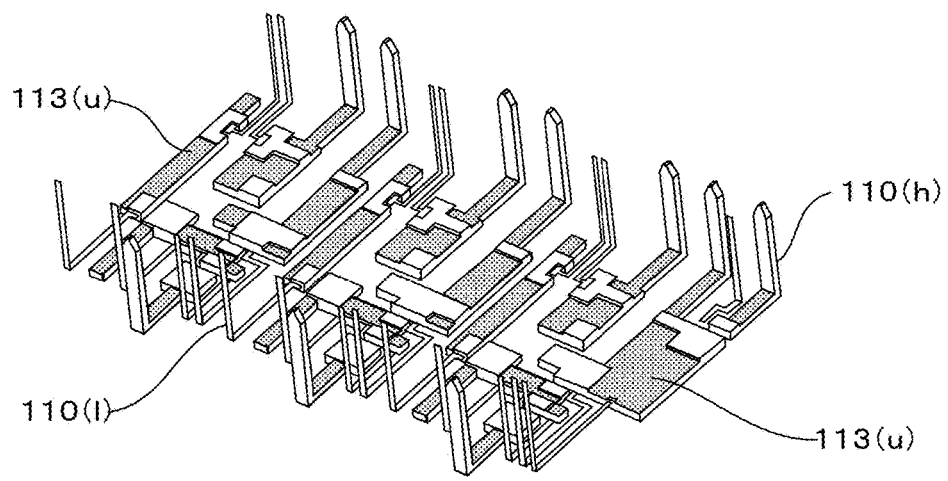
FIGS. 10A and 10B are perspective views illustrating an example where recess portions are provided to the lead frames, and a plate surface of the substrate according to the present invention is formed.
Figure 10B:
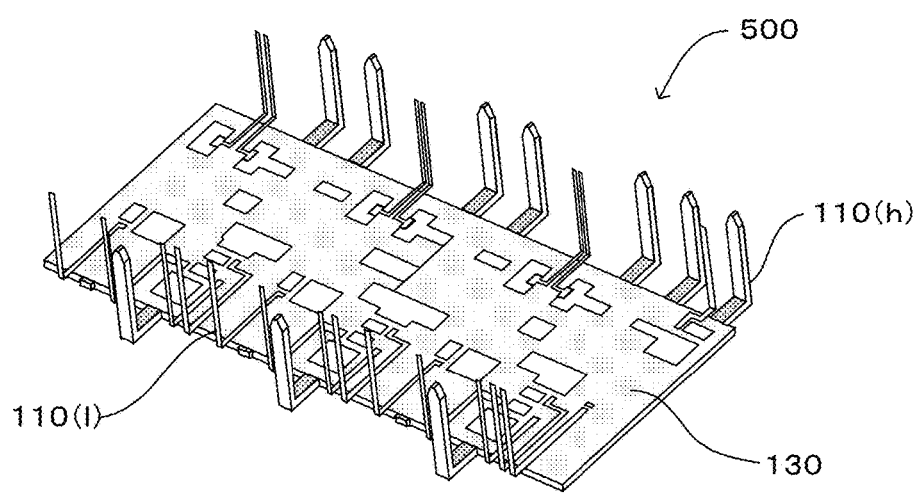

Further, the configuration of the insulating member 130 and the lead frames 110 is not limited to the configuration where the insulating member 130 are provided between the lead frames 110 as described above. A configuration where recess portions 113 can also be provided at portions other than the part mounting portions at the part arrangement surface side of the lead frames 110 as described below with reference to FIGS. 8A, 8B and subsequent figures and the recess portions 113 are also covered by the insulating members 130 may be adopted. In this regard, FIG. 8A is a perspective view illustrating a configuration example where the recess portions 113 are provided at the lead frame 110, and FIG. 8B is a sectional view illustrating a cross section passing a line X-X in FIG. 8A from a direction of arrows in FIG. 8A. Further, FIGS. 8A and 8B illustrate an example of only part of the lead frames 110 and the insulating members 130 without illustrating the entire substrate. FIGS. 10A and 10B described below illustrate a configuration example 500 as an entire substrate.

A configuration example shown in FIGS. 8A and 8B adopts a configuration where a portion at which the electronic part EC is not disposed on the plate surface (an upper side surface illustrated in the perspective view in FIG. 8A) of the part arrangement surface of the lead frame 110 on which the electronic part EC is mounted is provided with a top surface-side recess portion 113(*u*) on the plate surface of the part arrangement surface as shown in FIG. 8B, and the insulating members 130 are filled in the top surface-side recess portion 113(*u*) to cover the top surface-side recess portion 113(*u*) with the insulating member 130.

Further, according to the above configuration, the top surface of the insulating member 130 which covers the top surface-side recess portion 113(*u*) forms one continuous surface with the plate surface of the part arrangement surface of the lead frame 110 and the top surface at the part arrangement surface of the insulating member 130.

Furthermore, similarly, in the configuration example illustrated in FIGS. 8A and 8B, a portion which is the plate surface (a lower surface illustrated in the perspective view in FIG. 8A) of the back surface of the part arrangement surface of the lead frame 110 on which the electronic part EC is mounted, and which corresponds to the back surface of the portion of the part arrangement surface on which the electronic part EC is not disposed is provided at a back surface-side recess portion 113(*d*) on the plate surface of the back surface of the part arrangement surface and is covered with the insulating member 130, as illustrated in FIG. 8B. Additionally, according to this configuration, the top surface of the insulating member 130 which covers the back surface-side recess portion 113(*d*) forms one continuous surface with the plate surface of the back surface of the part arrangement surface of the lead frame 110 and the top surface of the insulating member 130 at the back surface-side at the part arrangement surface side. In this regard, although the method for forming the recess portions 113 is not limited in particular, it is possible to simultaneously mold the recess portions 113 by a means such as the pressing when the lead frames 110 are molded.

Hence, in the configuration example illustrated in FIGS. 8A and 8B, the insulating members 130 are filled in side surfaces between the lead frames 110 and are bonded with the lead frames 110. In addition, since the insulating members 130 can communicate with the both side surfaces of the lead frames 110 in a direction vertical to an axial direction (e.g. a direction along the X-X line shown in FIG. 8A) of the lead frames 110, the insulating member 130 can be also contacted and be bonded with the lead frames at the upper surface-side and the lower surface-side of the lead frames 110. Then, the insulating members 130 including the insulating member which is filled in the recess portions 113 are formed to form the identical plane together with the plate surface and the back surface-side of the part arrangement surface of the lead frame 110 as described above.

Therefore, in the configuration example illustrated in FIGS. 8A and 8B according to the present invention, a contact surface of the lead frames 110 and the insulating members 130 is expanded. As a result, it is possible to improve a bonding strength of the lead frames 110 and the insulating members 130.

Further, in the configuration example illustrated in FIGS. 8A and 8B according to the present invention, the plate surface of the part arrangement surface of the lead frames 110 and the top surface of the insulating members 130 are formed to form the identical plane together with the insulating members filled in the recess portions 113. Consequently, it is possible to perform solder feeding by using a metal mask instead of Dip solder feeding to mount the various electronic parts EC as well as to easily control a soldering range.

As well, the recess portions 113 are example configuration examples, and it is possible to appropriately dispose the recess portions 113 corresponding to the electronic circuits to form on the substrate. Hence, a form and an arrangement of the recess portions 113 are optionally provided corresponding to the electronic circuit and are not limited to the configuration example illustrated in FIGS. 8A and 8B. The recess portions may be disposed near part of the electronic parts, only the top surface-side recess portion 113(u) or only the back surface-side recess portion 113(d) may be disposed, or outlines of the recess portions 113 may be formed as curves. Further, the depths of recessed surfaces of the recess portions can be determined by taking into account the adhesion and the heat dissipation of the lead frames 110.

Back to FIGS. 4A and 4B, although the configuration components of the insulating members 130 are molded by using a composite insulating resin member such as polycarbonate or engineering plastics having the heat dissipation, the components are not limited thereto. The components can be selected by taking into account an insulation property, the heat dissipation and the compatibility with a material of the conductor plates composing the lead frames 110.

Further, the present invention adopts a structure in which the insulating members 130 fill in and spaces between and around the lead frames 110 of the wiring pattern shapes formed by the conductor plates as described above. Hence, the insulating members 130 can improve a rigidity of the entire electronic part mounting heat-dissipating substrate 100. Further, the insulating members 130 and the lead frames 110 can effectively dissipate the heat from the electronic parts mounted as described above.

Furthermore, in the electronic part mounting heat-dissipating substrate 100(s,d) according to the present invention, it is possible to integrally form the lead frames 110 formed in the wiring pattern shapes and the insulating members 130 by a method such as an insertion molding and to form the electronic part mounting heat-dissipating substrate 100(s,d). In this case, when the lead frames having the different thicknesses are used, it is also possible to form the substrate 100(d) by providing the lead frames of the different thicknesses in a mixed manner. Therefore, it is possible to dispose by taking into account a circuit configuration, the dispersion of heat generation areas or the like so that the thick lead frames and the thin lead frames are alternately disposed or plural thick lead frames and plural thin lead frames are disposed.

In this connection, according to the electronic part mounting heat-dissipating substrate 100(s, d) of the present invention, since the lead frames 110 of the wiring pattern shapes of the electronic circuits can be formed by the press molding, it is possible to reduce the cost due to a tact reduction. Further, for the same reason, since the mount of the terminals or the like are not necessary, it is also possible to reduce the cost due to the parts reduction. Furthermore, although a transfer molding is not used in the present embodiment, the present invention has advantages, in comparison with the substrate formed by the transfer molding, that an electrolytic capacitor and a choke coil to be necessary for a high temperature measure can be disposed in the same row and a step of a wire bonding is not necessary. Further, since it is possible to effectively prevent a warp of the substrate caused by the sudden heat generation, the present invention has an advantage that an expensive ceramic substrate used for a transfer module is not necessary.

Figure 9A:
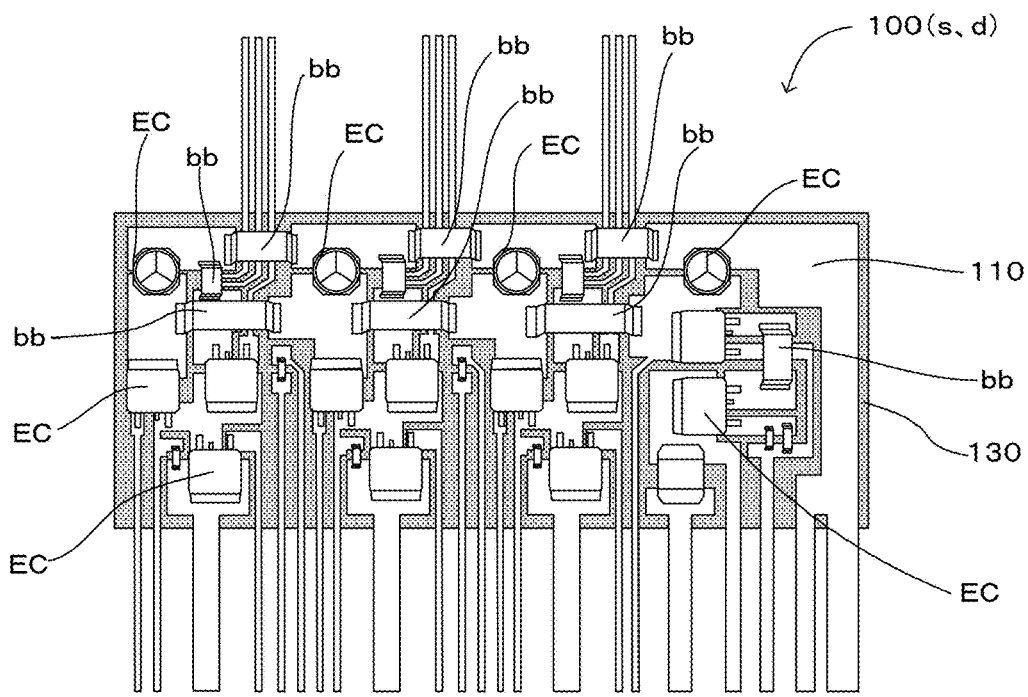
FIG. 9A illustrates an example where electronic parts EC are mounted at an upper surface-side of the electronic part mounting heat-dissipating substrate according to the present invention.

Next, FIG. 9A illustrates an example where the electronic parts EC are mounted at the upper surface-side of the electronic part mounting heat-dissipating substrate 100(s, d) according to the present invention formed as described above, and FIGS. 9B and 9C are side views of this example. In this regard, even when the substrate 100(s) including the lead frames 110 of the same thickness each other is used or when the substrate 100(d) including the lead frames 110 of the different thicknesses each other is used, the same configuration can be employed in FIG. 9A. Further, FIG. 9B illustrates the substrate 100(s) including the lead frames 110 of the same thickness each other, and FIG. 9C illustrates the substrate 100(d) including the lead frames 110 of the different thicknesses each other.

Here, the electronic parts EC and so on mounted at the upper surface-side of the electronic part mounting heat-dissipating substrate 100(s,d) include a semiconductor switching element for current control, a shunt-resistor for control current detection and a heat-generating part such as a high-capacitance electrolytic capacitor or the like. In addition, the electronic parts EC include a bus bar bb which connects the lead frames and is made of a metal plate such as the copper or the aluminum, a jumper pin and so on when necessary. Further, the electronic parts EC are not limited to packaged parts, and may be mounted by way of bare chip mounting.

Figure 9B:
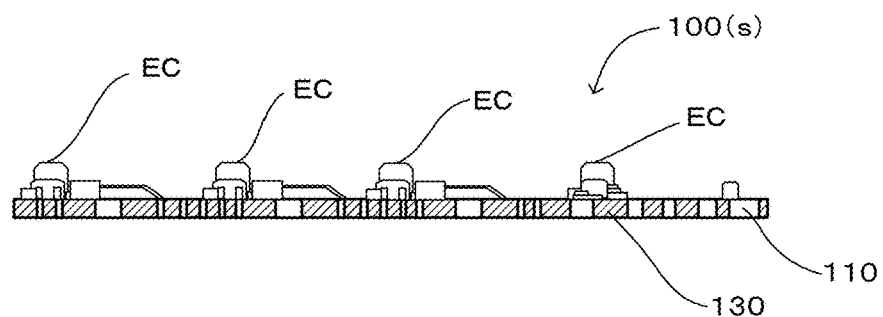
FIGS. 9B and 9C are respectively side views of this example.
Figure 9C:
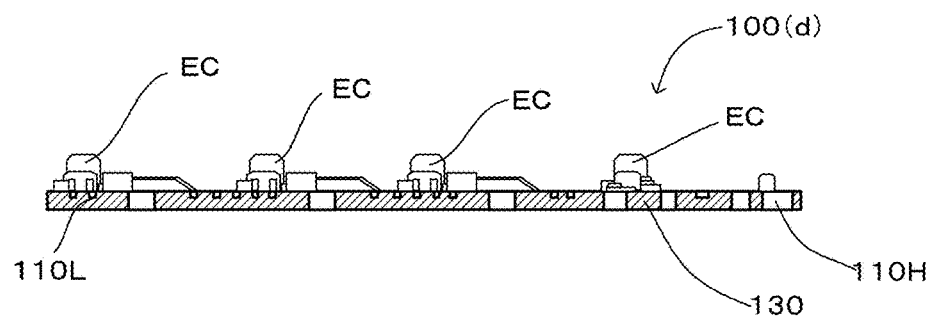

Then, as illustrated in FIGS. 9A to 9C, according to the electronic part mounting heat-dissipating substrate 100(s, d) according to the present invention, the electronic parts EC can be mounted directly on the lead frames 110 formed in the wiring pattern shapes of the electronic circuit.

Further, although not illustrated in FIGS. 9A to 9C, the mounted electronic parts EC can also be provided in a mirror arrangement, too. Consequently, when the electronic part mounting heat-dissipating substrate is used for the control unit of the electric power steering apparatus in particular, it is possible to easily support a specification of a right handle and a left handle. Further, according to the electronic part mounting heat-dissipating substrate 100(s, d) according to the present invention, the electronic parts EC can be mounted on both of the upper surface and the lower surface of the lead frames 110 formed by using the conductor plates, too. Therefore, there is an advantage that the substrate can be stereoscopically disposed.

Further, as described with reference to FIGS. 8A and 8B, FIGS. 10A and 10B are perspective views illustrating an example where the recess portions 113 are also provided to the lead frames 110, the insulating members 130 are filled not only between the lead frames 110 but also in the recess portions 113 to form a plate surface of the substrate 500. FIG. 10A is a perspective view illustrating a state of the lead frames 110 in which the insulating members 130 are not yet filled, and FIG. 10B is a perspective view illustrating a state of the substrate 500 in which the insulating members 130 have been filled. Besides, although only the top surface-side recess portions 113(u) of the recess portions 113 are illustrated, it is capable of providing the back surface-side recess portions 113(d). Further, the lead frames 110 are bent upward at an outer rim of the substrate in similar to an example in FIGS. 14A to 14C.

According to the present invention, as shown in FIG. 10A, portions which need to be reinforced by the insulating members 130 in the lead frames 110 which compose the substrate 500 are provided with the recess portions 113 in advance. Meanwhile, solder control portions of the lead frames 110 on which the electronic parts EC are mounted are left as they are. Consequently, it is possible to partially change the thicknesses of the lead frames 110.

Then, as illustrated in FIG. 10B, the insulating members 130 are filled between the lead frames 110 and in the recess portions 113, then, the lead frames 110 and the insulating members 130 form the identical plane, and only the portions at which the electronic parts EC are mounted are exposed on the substrate 500, so that it is possible to perform the solder feeding by using a metal mask instead of the Dip solder feeding and easily control a soldering range.

Figure 11A:
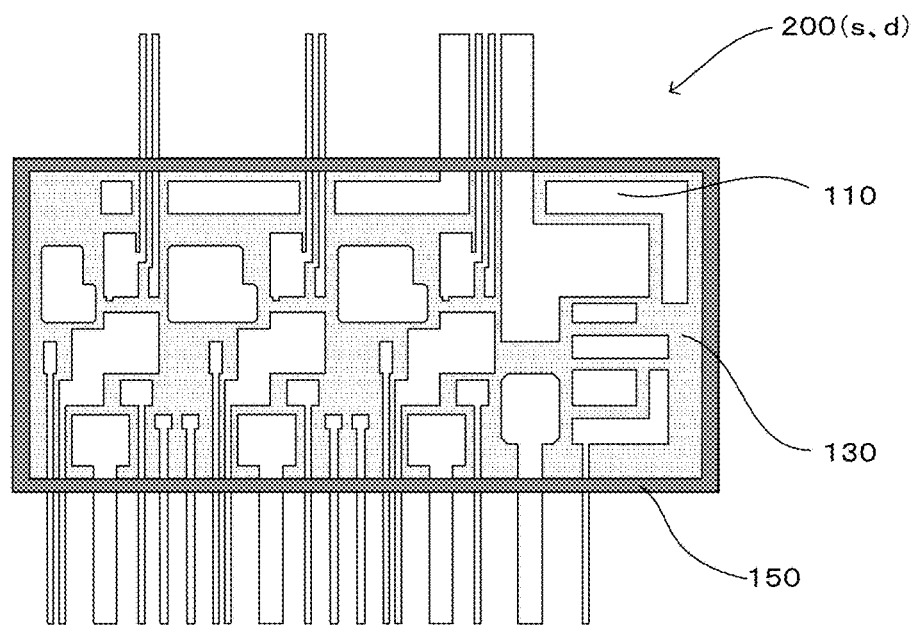
FIGS. 11A to 11C illustrate an example where a hem portion is provided to an outer rim of the substrate according to the present invention.
Figure 11B:
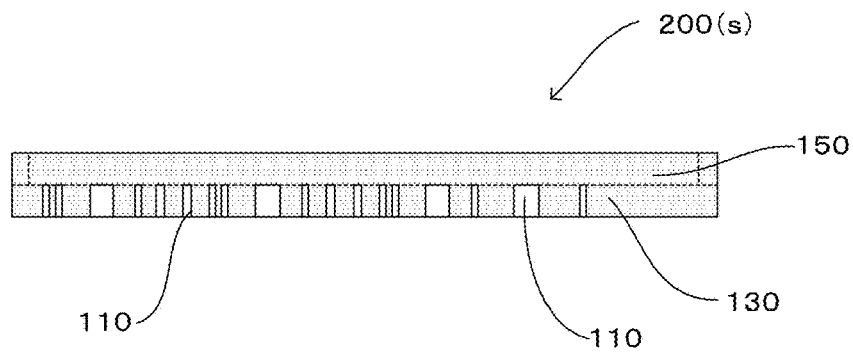
Figure 11C:
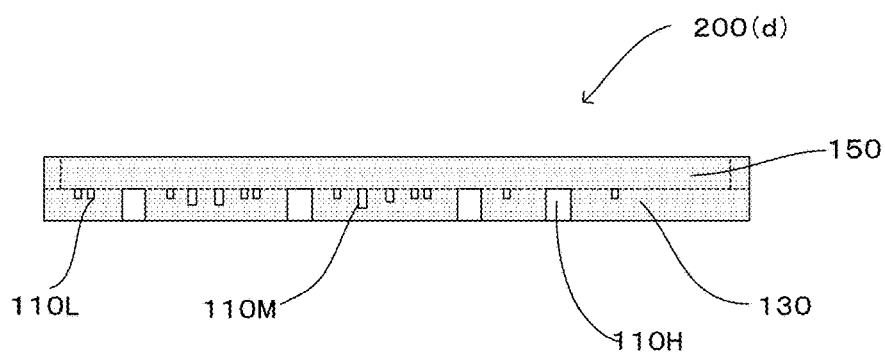

Further, FIGS. 11A to 11C illustrate an example of an electronic part mounting heat-dissipating substrate 200(s, d) in which a hem portion described below is provided to the outer rim of the substrate according to the present invention. FIG. 11A is a top view of this example, and FIG. 11B is a side view illustrating that the lead frames having the same thickness are used for the substrate 200(s). FIG. 11C is a side view illustrating that the lead frames having the different thicknesses each other are used for the substrate 200(d). In this regard, the substrate 200(d) includes three types of the lead frames 110H which have the thicknesses for a large current, the lead frames 110L which have the thicknesses for a small signal, and lead frames 110M in which an approximately middle current is applied, and which have the thicknesses for a middle current.

According to the electronic part mounting heat-dissipating substrate 200(s, d) shown in FIGS. 11A, 11B and 11C, a hem portion 150 formed in a closed curve shape is formed at periphery portions of the insulating members 130 composing the present invention and at the part arrangement surface-side of the electronic part mounting heat-dissipating substrate 200 with the insulating members 130. Here, although the hem portion 150 of the closed curve shape is formed in a rectangular shape to meet an outline of the outer rim of the insulating members 130, the above outline may be selected and configured with an arbitrary shape corresponding to the selected substrate shape.

According to the configuration of the present invention, by configuring and providing the hem portion 150 as described above, it is possible to further prevent the bonding portions of the lead frames 110 and the insulating members 130 from peeling and further to improve the rigidity of the electronic part mounting heat-dissipating substrate 200(s, d).

Figure 12A:
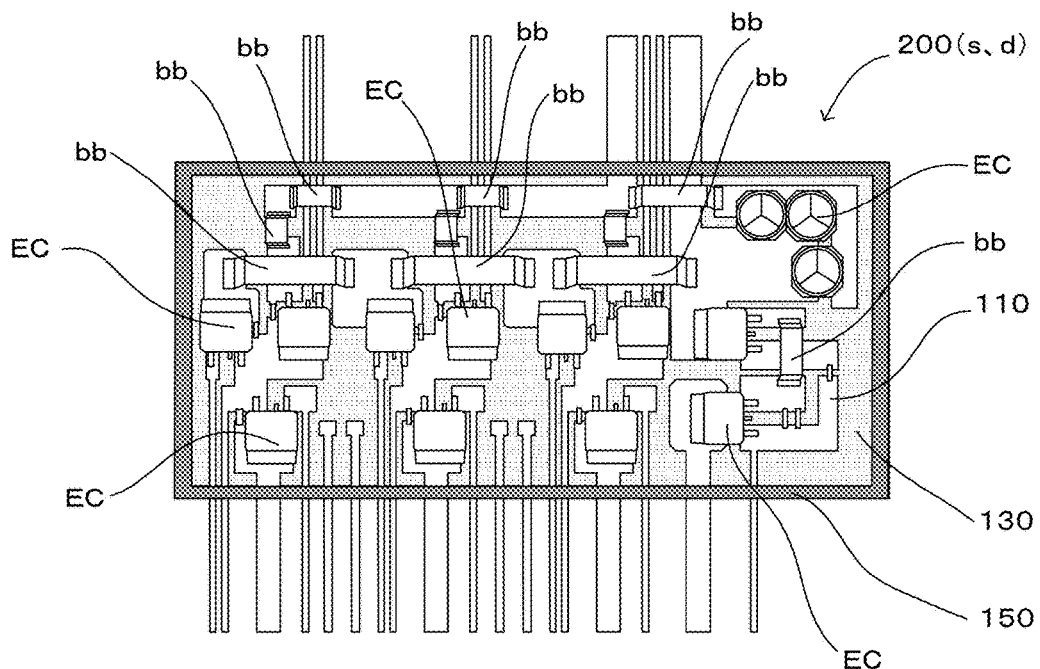
FIG. 12A is a top view illustrating that parts are mounted on the substrate illustrated in FIGS. 11A to 11C.
Figure 12B:
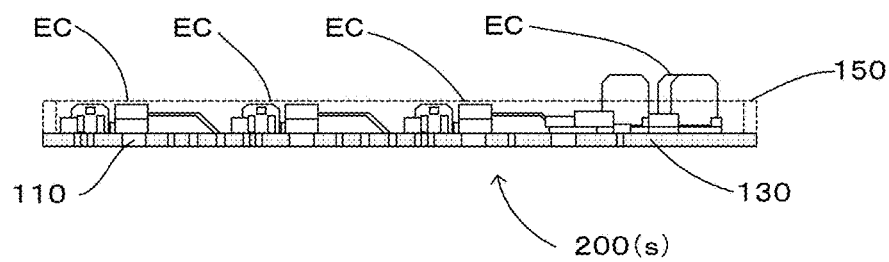
FIG. 12B is a side view illustrating that the lead frames having the same thickness are used for the substrate.
Figure 12C:
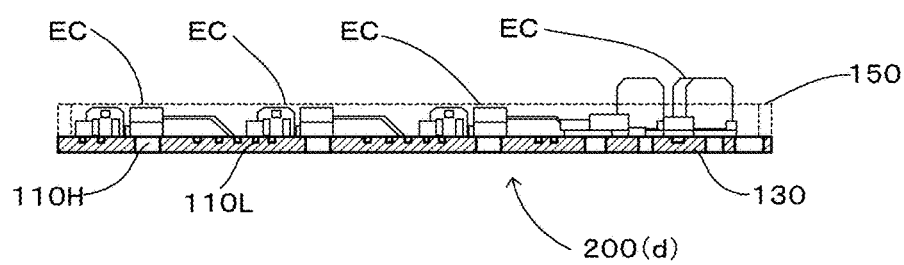
FIG. 12C is a side view illustrating that the lead frames having the different thicknesses are used for the substrate.

Further, as shown in FIGS. 11A to 11C, it is also possible to mold a resin on the electronic part mounting heat-dissipating substrate 200(s, d) illustrated in FIGS. 12A to 12C. FIG. 12A is a top view illustrating that the parts are mounted on the substrate illustrated in FIGS. 11A to 11C, FIG. 12B is a side view illustrating that the lead frames having the same thickness are used for the substrate, and FIG. 12C is a side view illustrating that the lead frames having the different thicknesses are used for the substrate.

In an example shown in FIGS. 12A to 12C, the electronic parts EC are mounted on the electronic part mounting heat-dissipating substrate 200(s, d) as shown in FIGS. 9A to 9C, a heat dissipation member is molded with the TIM inside (at a lower side of the portions indicated by dotted lines in FIGS. 12B and 12C) the hem portion 150 formed as described above and is placed in direct contact with the electronic parts.

Thus, according to the present invention, it is possible to further improve the heat dissipation from the electronic parts by adopting the above configuration. In this regard, in the embodiment, the hem portion 150 is provided only at the upper surface-side of the electronic part mounting heat-dissipating substrate 200(s, d). However, the hem portion 150 can also be provided not only at the upper surface-side but also at the lower surface-side or can also be provided only at the lower surface-side.

Further, the electronic part mounting heat-dissipating substrate according to the present invention can be housed in a housing of the control unit of the electric power steering apparatus and be used. In this way, based on a basic concept of the present invention, it is also possible to configure part of the housing of the control unit as a good heat conductor, and to adopt a heat dissipation structure of the control unit in which the back surface at the electronic part arrangement-side of the electronic part mounting heat-dissipating substrate and the portion composed of the good heat conductor of the housing of the control unit are disposed in contact with each other with an insulating film such as the TIM composed of the good heat conductor interposed therebetween.

Hence, when such a structure is adopted, a synergy effect of this structure and the heat dissipating structure of the control unit can further improve the heat dissipation of the electronic part mounting heat-dissipating substrate according to the present invention.

Figure 13A:
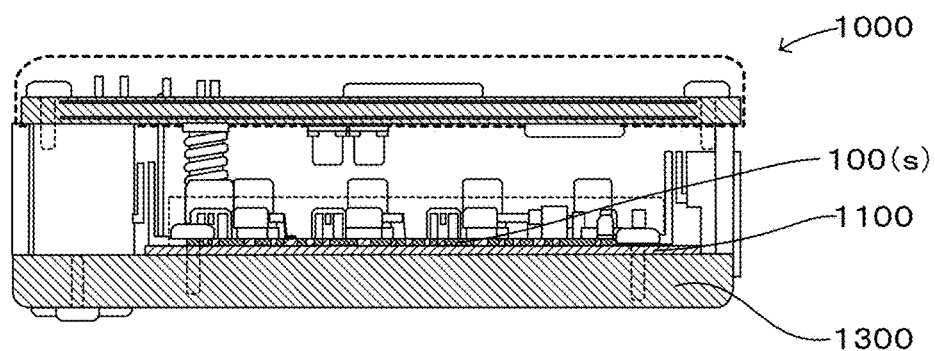
FIG. 13A is a side sectional view illustrating that the electronic part mounting heat-dissipating substrate according to the present invention is housed in a housing of a control unit.
Figure 13B:
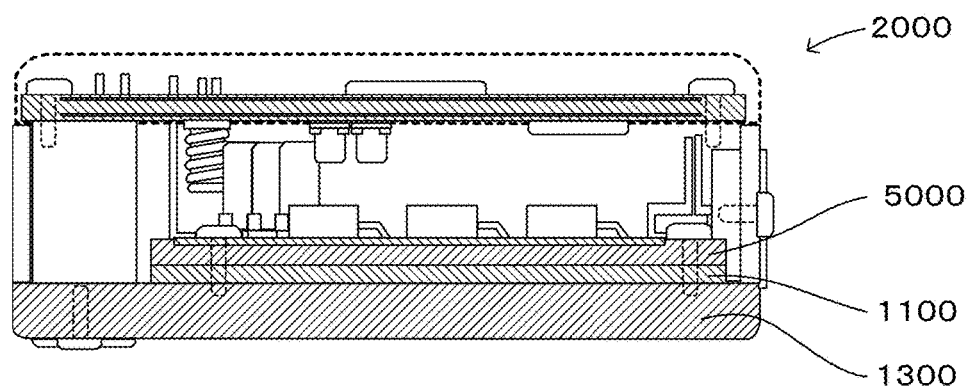
FIG. 13B is a side sectional view illustrating an example where a conventional substrate is housed in the control unit.

Then, FIG. 13A is a side sectional view illustrating that the electronic part mounting heat-dissipating substrate 100(s) according to the present invention is housed in a housing of a control unit 1000, and FIG. 13B is a side sectional view illustrating an example where a conventional substrate 5000 is housed in a control unit 2000.

Incase of the control unit 2000 in which the conventional substrate 5000 illustrated in FIG. 13B, a basic laminated structure from the upper side is formed in order of:
1. a heat dissipation surface of electronic parts (FETs or the like),
2. a solder layer,
3. a copper foil pattern layer,
4. an insulating layer,
5. an aluminum base substrate,
6. a TIM layer 1100, and
7. a case of the control unit 1000 and an aluminum die cast 1300 which is used as a radiator.

On the contrary, in case of the control unit 1000 in which the electronic part mounting heat-dissipating substrate 100(s) according to the present invention illustrated in FIG. 13A is housed, the basic laminated structure includes:
1. the heat dissipation surface of the electronic parts (the FETs or the like),
2. the solder layer, 3. a wiring pattern (copper whose plate thickness is approximately 0.3 [mm]),
4. the TIM layer 110, and
5. a case of the control unit 1000 and the aluminum die cast 1300 which is used as a radiator.

Therefore, according to the electronic part mounting heat-dissipating substrate 100(*s*) according to the present invention, in comparison with the conventional substrate 5000, it is possible to simultaneously simplify the laminated structure and increase the plate thickness of the lead frames 110 of the wiring pattern shapes formed by using the conductor plates. Further, it is possible to effectively dissipate the heat from the heat-generating electronic parts EC. As well, although the substrate 100(*s*) whose lead frames 110 have the same thickness has been used as the electronic part mounting heat-dissipating substrate in the above example, the same applies to the substrate 100(*d*) whose lead frames 110 have the different thicknesses, too.

Figure 14A:
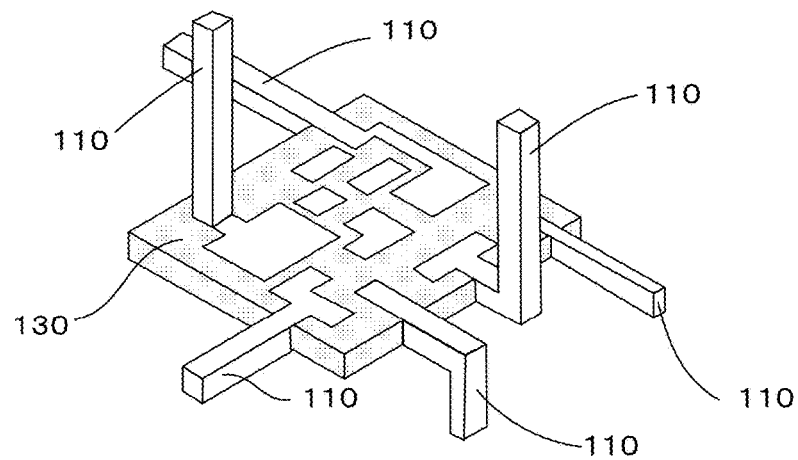
FIG. 14A is a perspective view illustrating an example where part of lead frames of wiring pattern shapes according to the present invention are bent and formed in one arbitrary direction of upper and lower directions with respect to the plate surface at an inner circumferential side or an outer circumferential side of the insulating member.

Further, according to the present invention, as shown in FIG. 14A, a part of the lead frames 110 of the wiring pattern shapes formed by the conductor plates can be also bent at an inner circumference side or an outer circumference side of the insulating member and in one arbitrary direction of upper and lower directions with respect to the plate surface of the conductor plate. Hence, when the part of the lead frames 110 are formed in this way, it is possible to easily connect the part of the lead frames 110 with a connection terminal or another substrate existing outside the electronic part mounting heat-dissipating substrate 100(*s*, *d*).

Figure 15A:
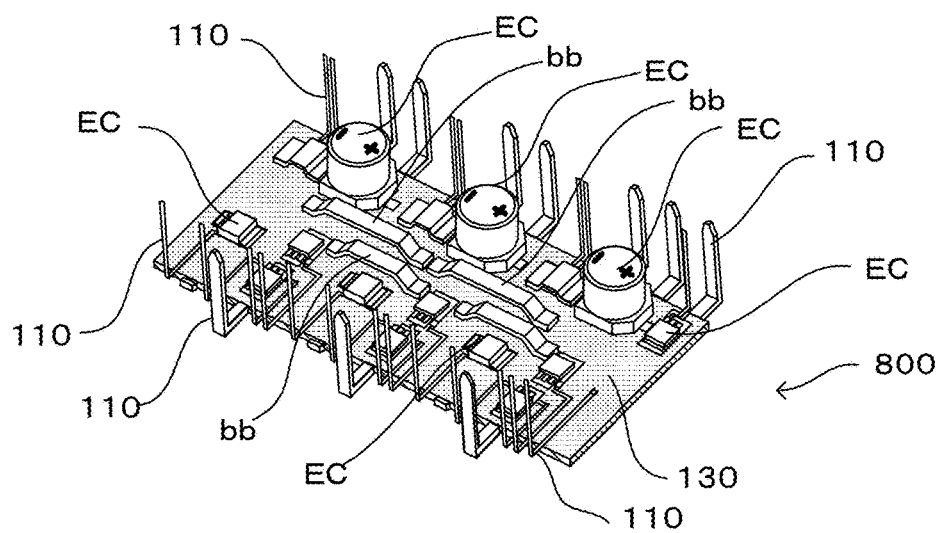
FIG. 15A is a perspective view illustrating an example which the lead frames are upwardly bent to the part arrangement surface of the substrate.
Figure 15B:
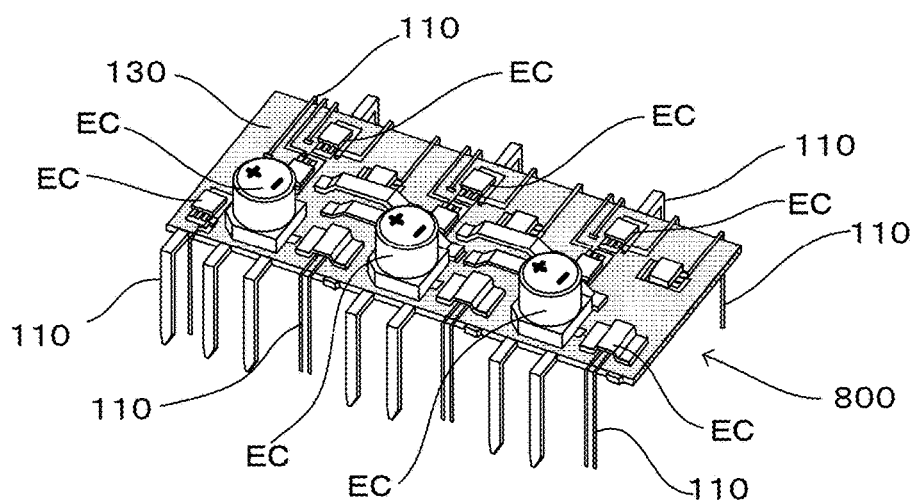
FIG. 15B is a perspective view illustrating an example which the lead frames are downwardly bent to the part arrangement surface of the substrate.

Furthermore, according to the present invention, the lead frames are not bent in advance as described above. Even after forming the above electronic part mounting heat-dissipating substrate, it is possible that all or a portion of the lead frames of the wiring pattern shapes formed by the conductor plate, is bendably formed at an outward of a periphery of the insulating member. FIGS. 15A and 15B are perspective views illustrating examples which the above lead frames 110 are formed on the electronic part mounting heat-dissipating substrate 800 in such a manner. FIG. 15A is a perspective view illustrating an example which the lead frames are upwardly bent to the part arrangement surface of the substrate 800, and FIG. 15B is a perspective view illustrating an example which the lead frames are downwardly bent to the part arrangement surface of the substrate 800. (Here, the above substrate 800 is considered as the power module of the three-phase control inverter for the EPS.)

Thus, the present invention has following advantages by enabling to be bent the above lead frames 110 in post processing.

That is, generally, a module substrate, which is molded by a resin or the like in order to integrate plural electronic parts into one package, is electrically connected to another resin substrate via the lead portion in normal. In this time, the above lead portion of the above module substrate is directed to a predetermined direction, and the direction of the lead frames is not freely changeable after connecting. Therefore, a degree of freedom for design and handling is obstructed.

On the other hand, the feature in the above embodiment of the present invention resides in that the above lead portion (the outward part of a periphery of the insulating member on the lead frames 110) is bent to the arbitrary direction in the post processing.

Thus, according to the above embodiment of the present invention, at first the above lead portion is formed in an unbent state, and it is possible to provide the above electronic part mounting heat-dissipating substrate as a common part. In a case that the above electronic part mounting heat-dissipating substrate is used in combination with other substrate, or is contained in the control unit or the like, it is possible to bend the above lead portion in accordance with a specification, subsequently. As a result, various combinations with the above electronic part mounting heat-dissipating substrate and the ECU or the like are possible, and a degree of freedom for design enables to increase when deciding the mounting position for the above electronic part mounting heat-dissipating substrate.

In the above configuration, a means and a configuration for bendably forming the lead frames 110 are not especially limited. However, considering the material of the lead frames 110 or the like, the material, which a brittle fracture does not occur after the bending at least a few times, is desirable.

Figure 14B:
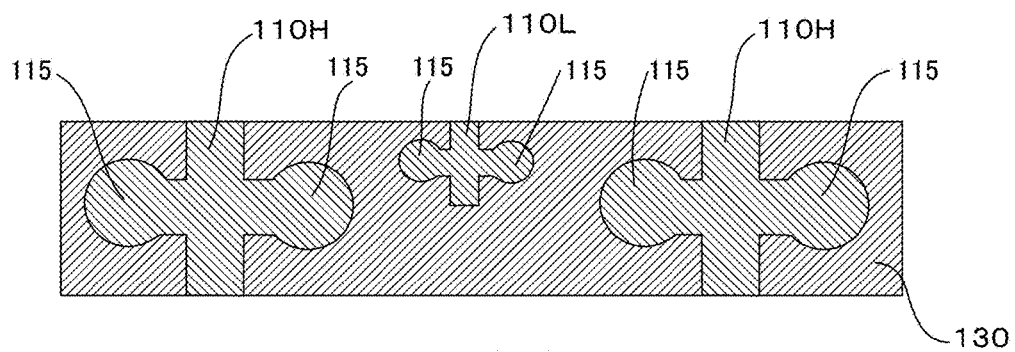
FIGS. 14B and 14C are side sectional views illustrating examples of engagement portions.
Figure 14C:
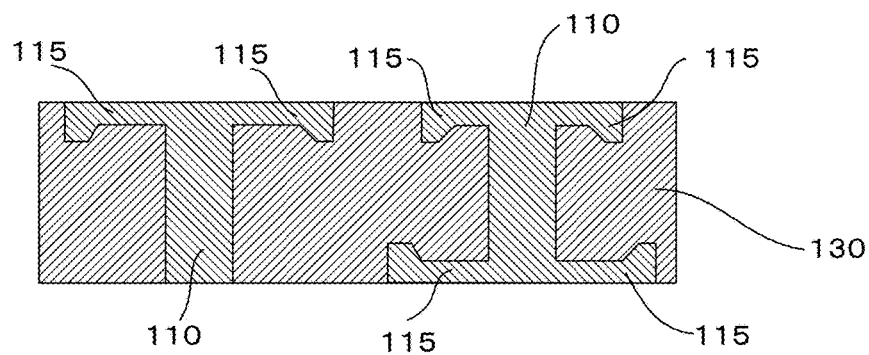

Back to FIGS. 14A, 14B and 14C, according to the present invention, as illustrated in sectional views in FIGS. 14B and 14C, it is possible to employ a configuration where engagement portions 115, which engage with the insulating members 130, are provided on the side surface of the lead frames 110 of the wiring pattern shapes at the side of the insulating members 130. The engagement portions 115 are formed from the side surface side of the lead frames 110 to the side of the insulating members 130. At the side of the insulating members 130 of the engagement portions 115, an area seen from the side surface-side of the lead frames 110 is formed larger than an area seen from the side surface-side of the lead frames 110 of the engagement portions 115. Consequently, the engagement portions 115 can reinforce a bond of the bonding portion of the lead frames 110 and the insulating members 130, and it is possible to provide a configuration which prevents a peel from easily occurring due to a difference in a thermal expansion coefficient between the lead frames 110 and the insulating members 130.

Further, in a case of assuming that a case of a configuration where the engagement portions 115 are provided at one or both of the top surface-side and the back surface-side of the lead frames 110 as shown in FIG. 14C, a heat transfer area of the lead frames 110 is further expanded so that it is possible to further improve the heat dissipation.

Figure 16A:
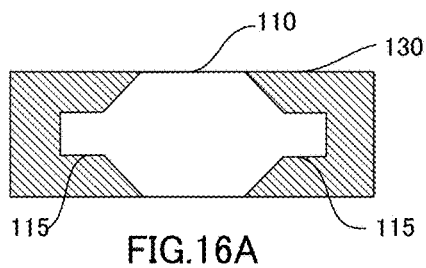
FIG. 16A is a sectional view illustrating an example where the engagement portions of protrusion portions formed by lines at center portions of both side surface rims of the lead frame.

Furthermore, FIG. 16A is a sectional view illustrating a configuration where the engagement portions 115, which engage with the insulating members 130, are provided on the side surface of the lead frames 110 of the wiring pattern shapes at the side of the insulating members 130. According to this configuration, it is also possible to form a shape assuming that the lead frames 110 of the wiring pattern shapes are mass-produced by the press-working. Here, features of outer shapes of the engagement portions 115 of the lead frames 110 include that all lines are combined, and linear shapes are formed from a tapered shape to a protrusion portion at a center portion over an entire area of a side surface rim portion. Consequently, it is possible to increase the surface areas of the lead frames 110 of the wiring pattern shapes. Accordingly, it is possible to provide an effect of expanding the heat transfer and the heat dissipation surfaces, increasing an engagement area which engages with the insulating members 130, too, and strengthening the coupling. Thus, it is possible to further improve a coupling strength and the heat dissipation.

Figure 16B:
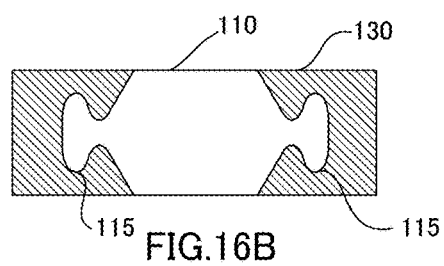
FIGS. 16B to 16H are sectional views illustrating other examples of the engagement portions.
Figure 16C:
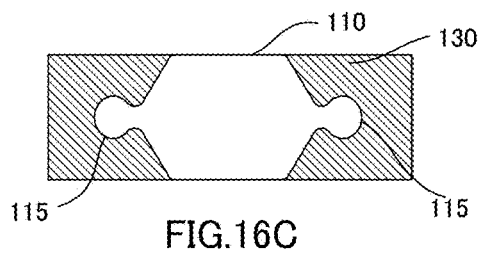
Figure 16D:
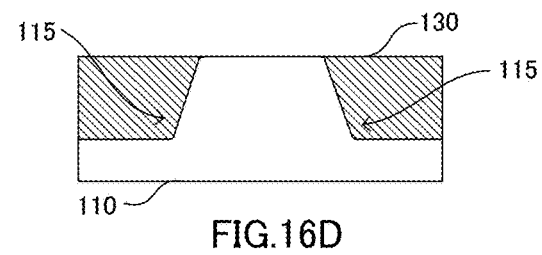
Figure 16E:
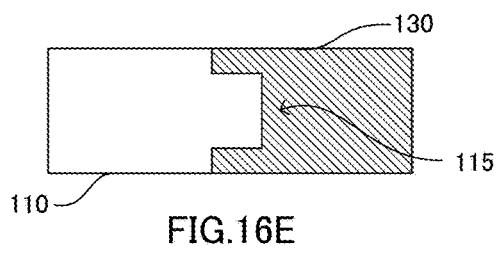
Figure 16F:
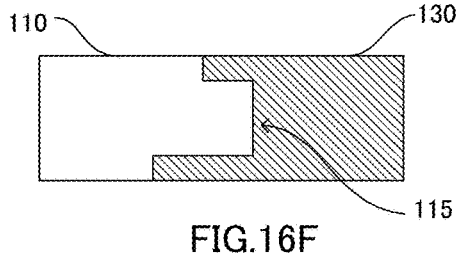
Figure 16G:
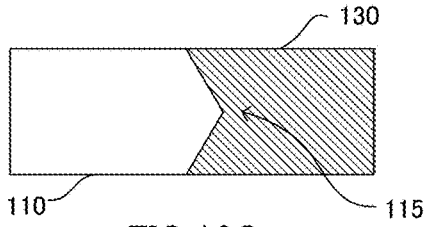
Figure 16H:
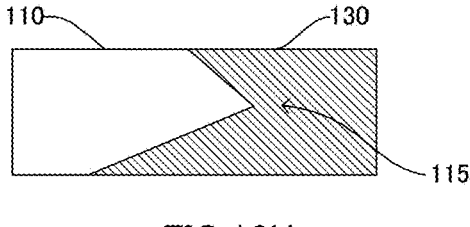
Figure 16I:
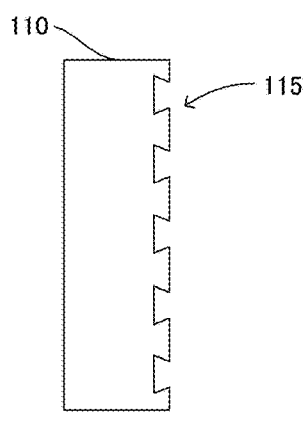
FIG. 16I is a top view illustrating another example of the engagement portion.

Further, it is also possible to adopt forms of the engagement portions 115 illustrated in FIGS. 16B to 16I and subsequent drawings. As well, FIGS. 16B to 16D are sectional views illustrating the engagement portions 115 of the lead frames from the side surfaces at both plate surfaces of the lead frames, FIGS. 16E to 16H are sectional views illustrating the side surface of the single plate surface of the lead frames, and FIG. 16I is a top view illustrating the side surface-side of the plate surface of the lead frame.

In the examples shown in FIGS. 16B and 16C, the top surface-side and the back surface-side of the side surfaces of the lead frames to the center portion-side of the side surfaces are formed as inclined surfaces formed protruding toward the insulating members, the inclined surfaces have triangular cross sections, and engagement shapes whose cross sections are circular shapes or elliptical shapes are smoothly formed from the inclined surfaces at the coupling portions of the inclined surfaces. That is, FIG. 16B illustrates the example of a configuration where the engagement portions 115, which engage with the insulating members 130, are provided on the side surface of the lead frames 110 of the wiring pattern shapes at the side of the insulating members 130. It is also possible to form a shape assuming that the lead frames 110 of the wiring pattern shapes are mass-produced by the press-working. Then, features of the outer shapes of the engagement portions of the lead frames 110 include that the outer shapes are sponge-gourd (loofah) shapes and are formed by combining plural curves. The features further include that curved surface shapes of the sponge-gourd shapes in the entire side-surface rim portion allow the insulating members 130 to smoothly spread to the surrounding of the engagement portions 115 to strengthen the coupling of the insulating members 130 and the engagement portions.

Further, FIG. 16C shows an example where features of the outer shape of the engagement portions of the lead frame 110 include that the outer shape is a tumbling-doll shape and is formed by combining plural curves. In similar to the above case, the features further include that a curved surface shape of the tumbling-doll shape in the entire side-surface rim portion allows the insulating members 130 to smoothly spread to the surrounding of the engagement portions 115 to strengthen the coupling of the insulating members 130 and the engagement portions. Consequently, in the examples illustrated in FIGS. 16B and 16C, it is possible to increase the surface areas of the lead frames 110 of the wiring pattern shapes by adopting the sponge-gourd shapes and the tumbling-doll shapes. In addition, it is possible to expand the heat transfer and the heat dissipation areas, and an increase in the engagement area which engages with the insulating members 130 and dent portions at the center portions of the sponge-gourd shapes strengthen the coupling of the lead frames 110 and the insulating members 130.

Further, FIG. 16D illustrates an example where each engagement portion is formed by an inclined surface formed from one plate surface of the lead frame to the other plate surface, and an engagement piece (a protrusion portion formed as a stepwise step) formed in parallel to the other plate surface. That is, in similar to the above examples, this example adopts a shape assuming that the lead frames 110 of the wiring pattern shapes are mass-produced by the press-working. Features of the outer shapes of the engagement portions of the lead frames include that the outer shapes are formed by combining all lines, and a protrusion portion composed of stepwise steps extended from a nearly center of the side surface rim portion is formed in a linear shape.

Furthermore, FIGS. 16E and 16F illustrate examples where the engagement portions are formed by providing steps at the top surface-side and the back surface-side of the side surfaces of the lead frames and between the lead frames and the insulating members. Depths of the steps of the engagement portions (i.e., lengths formed by extending the insulating members from the side surface portions of the lead frames to the center direction of the plate surfaces of the lead frames by shapes of the steps) may differ between the top surface-side and the back surface-side of the side surfaces of the lead frames. For example, as shown in FIG. 16F, the depths of the steps of the engagement portions may be formed larger at the back surface-side of the side surfaces of the lead frames.

Still further, FIGS. 16G and 16H illustrate examples where the engagement portions are formed by inclined surfaces formed protruding toward the side of the insulating members from the top surface-side and the back surface-side of the side surfaces of the lead frames to a center portion-side of the side surfaces. FIG. 16G illustrates that a cross section of the inclined surface is a triangular shape. FIG. 16H illustrates that base point portions from the top surface-side and the back surface-side of the inclined surface are shifted from positions on a vertical line of the plate surface of the lead frame between the top surface-side and the back surface-side.

As described above, the engagement portions illustrated in FIGS. 16A to 16H are easily molded by the press-working, and are able to increase the engagement area and to increase the heat dissipation and the mechanical coupling strength. The tumbling-doll shape, the sponge-gourd shape and the stepwise steps are formed on a boundary surface between the lead frames and the insulating members. Consequently, it is possible to achieve an effect of suppressing moisture entering due to dew condensation on the substrate and so on.

Further, FIG. 16I illustrates an example where the engagement portion is formed by forming recess portions in the side surface of the lead frame and along the plate surface of the lead frame. FIG. 16I illustrates the example where each recess portion is formed wider at a depth side (i.e., a center direction of the plate surface of the lead frame) than an open end-side of the recess portion. Hence, when the engagement portion is formed in a so-called keyhole shape, the engagement portion is formed along the side surface of the plate surface when the plate surface of the lead frame is seen from an upper surface. Consequently, it is possible to easily perform the molding by the press-working, and to increase the engagement area as described above and further to increase the heat dissipation and the mechanical coupling strength.

As well, the above engagement portions are exemplary engagement portions. By optionally changing parameters (e.g. step depths) of the above-described engagement portions, it is possible to perform adjustment according to a characteristic of a circuit composed of the lead frames.

Figure 16J:
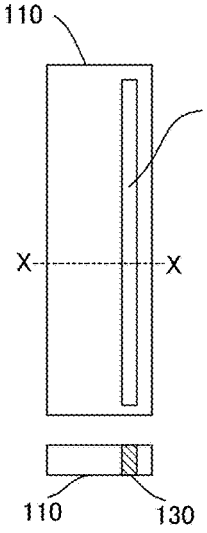
FIGS. 16J and 16K are top views illustrating examples where a resin sealing shape is provided closer to an inner side from a side surface of the lead frame.
Figure 16K:
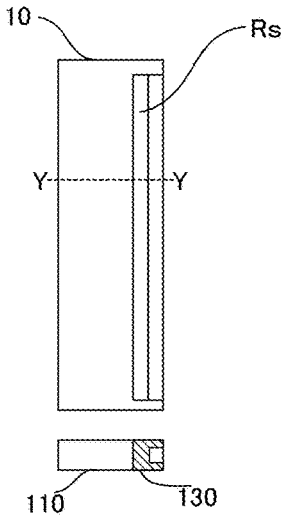

Further, according to the present invention, as shown in FIGS. 16J and 16K, it is also possible to provide a resin sealing shape Rs which is formed closer to an inner side from the side surface of the plate surface of the lead frame and penetrates the top surface and the back surface of the lead frame. Here, a top view in FIG. 16J is a top view of the plate surface of the lead frame, and a bottom view of FIG. 16J is a sectional view of an X-X line portion of the top view. A top view in FIG. 16K is a top view of the plate surface of the lead frame, and a bottom view of FIG. 16K is a sectional view of a Y-Y line portion of the top view. The resin sealing shape Rs is a hole formed to penetrate the top surface and the back surface of the lead frame as described above. The resin sealing shape R may have a rectangular shape or a circular shape as shown in FIGS. 16J and 16K, and the size and the shape of the resin sealing shape Rs are not limited in particular. According to the present invention, by providing the resin sealing shape Rs, it is possible to improve the bonding strength of the lead frames and a resin for making the insulating member. However, combining the recess portions and the engagement portions formed in the lead frames according to the present invention in particular enables more effective use. That is, FIG. 16K illustrates the example where the resin sealing shape Rs is formed inside the stepwise engagement portion illustrated in the examples in FIGS. 16E and 16F. However, by using the above configuration in combination, it is possible to more effectively improve the mechanical coupling strength of the lead frames and the insulating members.

Figure 17:
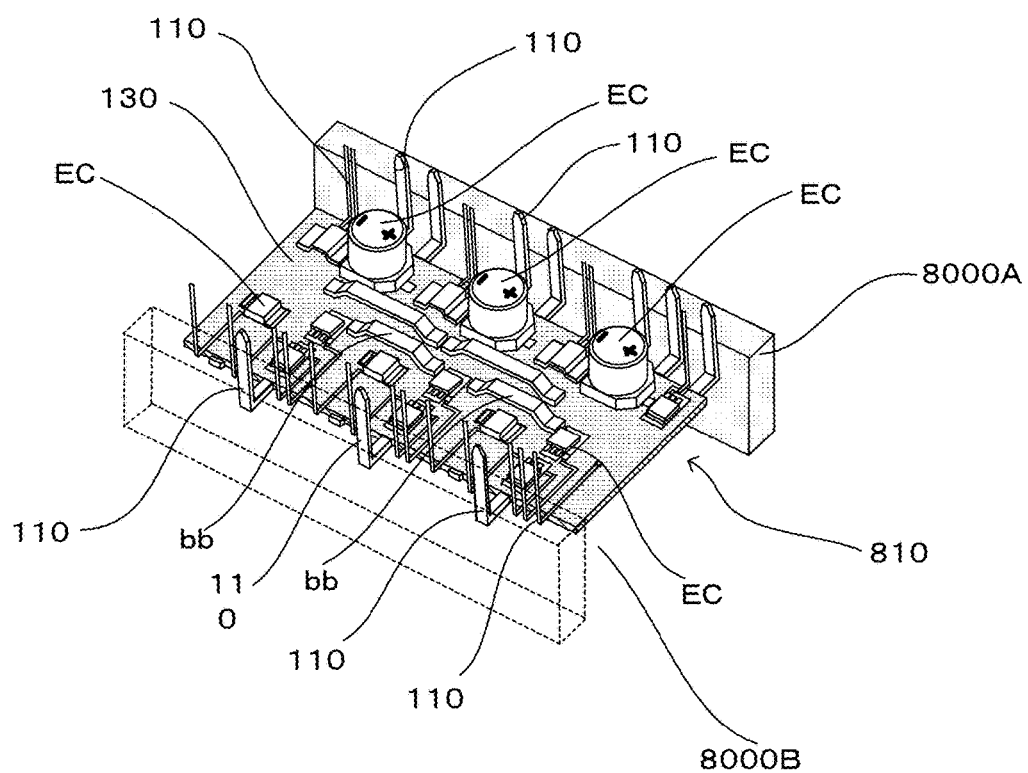
FIG. 17 is a perspective view illustrating an example where the lead frames of the electronic part mounting heat-dissipating substrate according to the present invention abut a heat conductor at an outward of a periphery of the insulating member.

According to the present invention, it is possible that a structure, which enhances the heat-dissipation from the electronic part mounting heat-dissipating substrate via the lead frames 110 as shown in FIG. 17, is adopted. FIG. 17 is a perspective view illustrating an example that the lead frames 110 of the electronic part mounting heat-dissipating substrate abuts to the heat conductor 8000 at the outward of the periphery of the insulating member. In FIG. 17, the heat conductor 8000 comprises heat conductors 8000A and 8000B which are taken along two rows of the lead frames 110. The heat conductor 8000B is illustrated by the dotted lines (in order to clarify the relationship with the substrate 800). Since other substrate is connected with the ends of the lead frames 110, the heat conductor 8000 abuts to the lead frames 110, and the ends of the lead frames are not in contact with the heat conductor 8000.

The heat conductor 8000 enables to constitute by an arbitrary heat conductive material. Basically, in order to be secured the insulation to the lead frames 110, it is necessary that electrical insulation is secured at the abutment portions to the lead frame. Then, the overall heat conductor is constituted by the insulating material, or even in a case that the overall heat conductor is constituted by the electrical conductive material, it is necessary to use a heat conductive material (TIM) having the electrical insulation at the surface of the heat conductor. The above configuration is not limited to the examples, even in a case that the heat conductor 8000 is constituted by the electrical conductor, the electrical insulation between the heat conductor 8000 and the abutted lead frames 110 has only to be secured. The heat conductivity and the electrical insulation may be secured by coating the electrical insulating material to the portion of the lead frames 110 which are abutted to the heat conductor 8000.

In a configuration example as shown in FIG. 17, the heat generated from the electronic parts EC is conducted as follows. That is, the electronic parts EC are mounted to the lead frames 110 on the part mounting surface of the electronic part mounting heat-dissipating substrate 800 according to the present invention. As shown in FIG. 17, since a structure that all or a portion of the lead frames 110 of the wiring pattern shapes formed by the conductor plate is abutted to the heat conductor 8000 at the outward of the periphery of the insulating member 130 is adopted, the heat generated from the electronic part EC can be conducted to the outside via the heat conductor 8000.

In the structure that the lead frames 110 are abutted to the heat conductor 8000, especially the limit is not provided. As shown in FIG. 17, in a case that the rows of the lead frames 110 are abutted along plate surfaces of the heat conductor 8000, the heat conduction is effectively conducted since the heat conductive area is large.

Further, in the example shown in FIG. 17, although two heat conductors (8000A, 8000B) are disposed on two side surfaces at the periphery of the substrate 800, the heat conductors 8000 can be disposed on the four side surfaces by extending the lead frames 110 to the four side surfaces at the periphery of the substrate 800.

Similarly, in the example of FIG. 17, although the lead frames 110 are bent upwardly, it is possible to perform the heat conduction by abutting the lead frames 110 to the heat conductor 8000 irrespective of matter whether the lead frames 110 are bent or not, or the lead frames 110 are bent upwardly or downwardly. When it is considered that the heat conductors are required to be combined with the case which houses the substrate, or other substrate, a structure that a part of the lead frames 110 is abutted to the heat conductor 8000 can be adopted.

Further, according to the present invention, the part arrangement surface is provided on both surfaces of the electronic part mounting heat-dissipating substrate, and the reductant circuit which includes at least similar dual-system circuit is formed on the electronic part mounting heat-dissipating substrate.

In the above case, the first-system circuit of the dual-system circuit is formed on the first surface of the electronic part mounting heat-dissipating substrate, the second-system circuit of the dual-system circuit is formed on the second surface of the electronic part mounting heat-dissipating substrate, and the common lead frames which are commonly used in a portion of a circuit wiring are used to the first surface and the second surface of the electronic part mounting heat-dissipating substrate. By using the above configuration and a cross-driving as described below, it is possible to improve a fault tolerance and suppress the current passing through the electronic parts.

That is, for example, the inverter circuit for the electric motor comprising the three-phase brushless motor of the electric power steering apparatus will be explained with reference to FIGS. 18 and 19.

Figure 18:
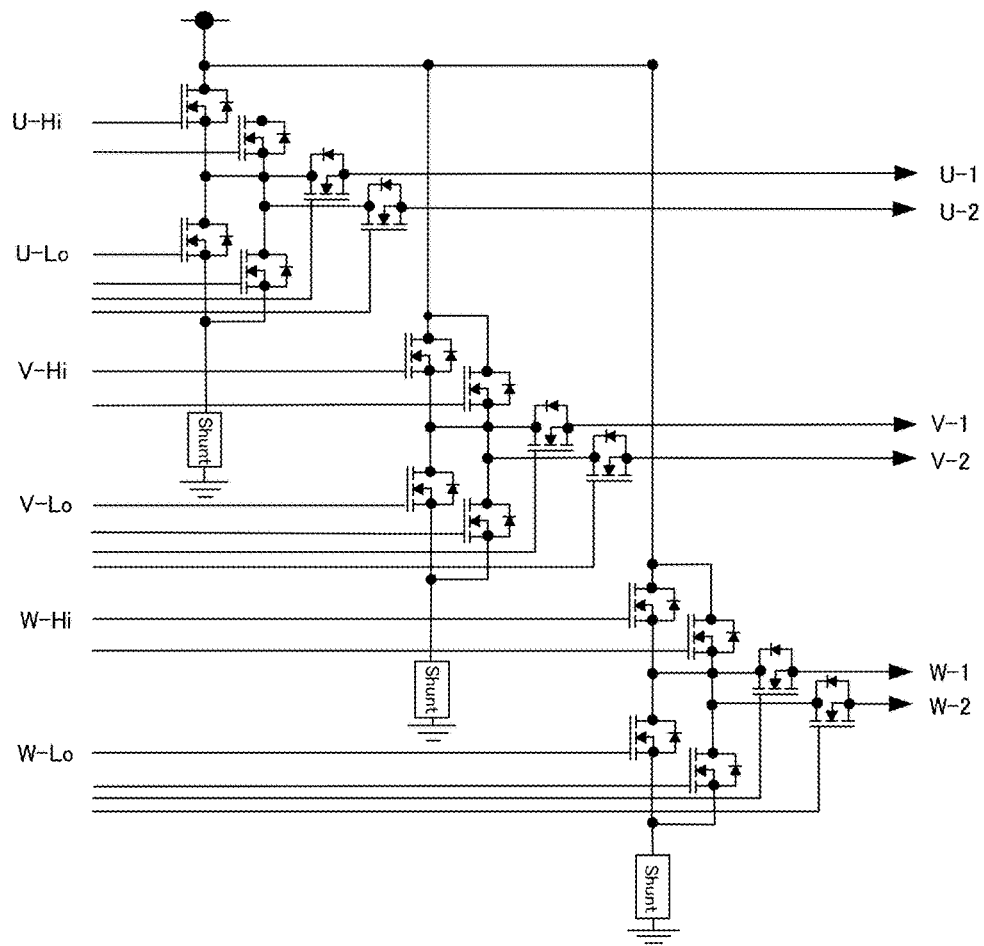
FIG. 18 is a circuit diagram of an example where inverter circuits and motor opening switches which are used to a three-phase brushless motor in the electric power steering apparatus as shown in FIG. 3, are reductant.

FIG. 18 shows a circuit diagram of an example where the inverter circuits 37 and the motor release switches 23 which are used to the three-phase brushless motor in the electric power steering apparatus as shown in FIG. 3, are reductant.

In the circuit shown in FIG. 18, a combination of an upper arm and a lower arm including upper stage FETs and lower stage FETs, which are composed of respective U-phase, V-phase and W-phase in the circuit as shown in FIG. 3, and the FETs corresponding to respective phases against the motor release switches 23 are provided dual-system as a reductant circuit. Therefore, in comparison with the U-phase of FIG. 3, the output lines from the gate driving section 36B are connected to the upper and lower arms of the dual-system as U-Hi and U-Lo in FIG. 18. In comparison with the output line to the motor 20 of FIG. 3, the dual-system, which has U1 and U2 from the upper and lower arms, is provided in FIG. 18. Similar configuration is adopted in V-phase and W-phase. A shunt resistor Sh in FIG. 18 is connected to the motor current detecting means 38.

Therefore, in the embodiment of the present invention, a power supply and a pre-driver of the electric power steering apparatus are integrated into one system. A partial reductant system comprises inverter circuits and motor wirings as the dual-system. Thus, although a perfect fail-safe (reductant) is not satisfied, depending on the fault event, an assist control by the motor of the electric power steering apparatus enables to partially continue by cross-energization as described below or the like. Since the maximum current rating of the power device (FET) decreases by substantially 50%, the power device can be more miniaturization.

Figure 19A:
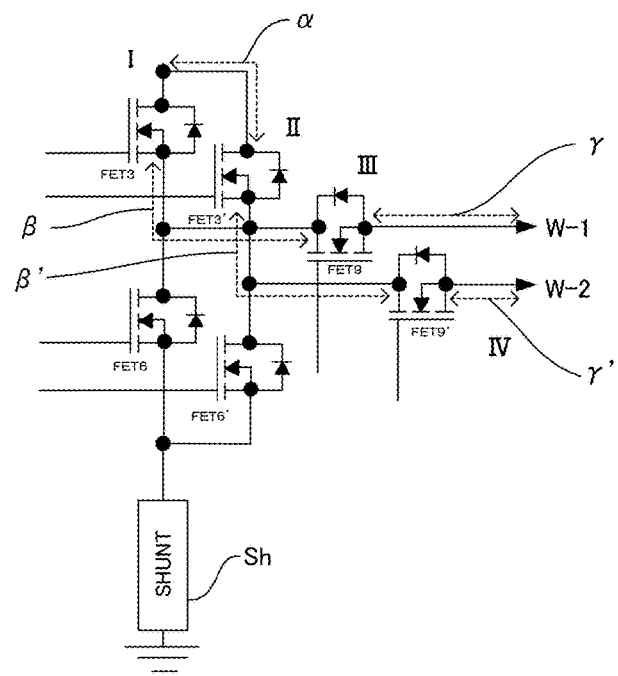
FIG. 19A and FIG. 19B are diagrams illustrating a mounting example of part of the reductant circuit.
Figure 19B:
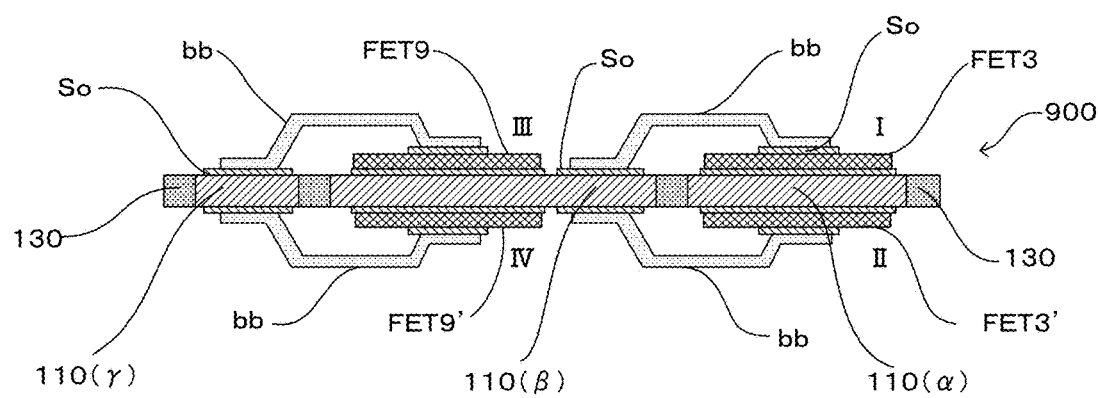

FIG. 19A and FIG. 19B are diagrams illustrating a mounting example of part of the reductant circuit, FIG. 19A is a circuit diagram illustrating the reductant circuit of a W-phase part in the three-phase as shown in FIG. 18, and FIG. 19B is a concrete side sectional view illustrating an example where the lead frames are commonly used in the W-phase part and the circuit wiring part in the electronic part mounting heat-dissipating substrate according to the present invention.

As shown in the example of the W-phase in FIG. 19A, in the embodiment illustrated in the circuit diagram in FIG. 18 of the present invention, in addition to a group of first upper and lower arms comprising the upper stage FET3(*a* portion shown by I in FIG. 19A) and the lower stage FET6, and the FET9 (a portion shown by III in FIG. 19A) of the motor release switch which is connected to the first upper and lower arms, a group of second upper and lower arms comprising the upper stage FET3' (a portion shown by II in FIG. 19A) and the lower stage FET6', and the FET9' (a portion shown by IV in FIG. 19A) of the motor release switch which is connected to the second upper and lower arms, are provided as the reductant system.

In the circuit shown in FIG. 19A, since a circuit wiring which is indicated by an arrow dashed line α is the circuit wiring from a power supply, part of the circuit wiring is commonly used in the reductant circuit. (β, β') and (γ, γ') which are similarly shown, are also part of functionally common usable circuit wirings in the reductant circuit.

In the present invention, as shown in FIG. 19B, the upper stage FET3(*a* portion shown by I in FIG. 19B) in the first-system circuit of the dual-system, and the FET9 (a portion shown by III in FIG. 19B) of the motor release switches are formed on a top surface of the electronic part mounting heat-dissipating substrate 900 according to the present invention (top surface in FIG. 19B). The upper stage FET3' (a portion shown by II in FIG. 19B) in the second-system circuit of the dual-system, and the FET9' (a portion shown by IV in FIG. 19B) of the motor release switches are formed on a back surface of the electronic part mounting heat-dissipating substrate 900. (In FIG. 19B, a bare chip is used to the FET, and a solder So is used to mount the FET and a bus bar bb or the like to the substrate.) Further, in the example of FIG. 19B, using the lead frames 110(α), 110(β) and 110(γ), the commonly usable circuit wiring portions (α, β, β') and (γ, γ')) in the reductant circuit are adopted to a configuration that are commonly used to the reductant circuits on top and back surfaces.

In this connection, according to the above configuration, by dividing a current route to the dual-system, it is possible to share a half amount of the current with reductant dual-system circuit wirings. In a normal route, the current passes from the portion I to the portion III or from the portion II to the portion IV. In a case that a fault occurs in the reductant circuit, depending on the fault mode of the FETs, the current enables to pass from the portion I to the portion IV or from the portion II to the portion III (crossing the top surface with the back surface).

According to the embodiment of the present invention, as described above, the reductant circuits which are composed of the three-phase and are mounted on the both surfaces of the substrate 900, are used in combination with the reductant circuits which are configured over the first surface and the second surface of the substrate 900. By providing the dual-system circuits as described above, the current that passes through a circuit element can be dispersed in a normal state. Accordingly, in a case when a fault occurs due to a failure, it is possible to reduce or avoid the fault.

Next, it is possible to adopt a following connection structure of the shunt resistor by using the electronic part mounting heat-dissipating substrate according to the present invention.

Here, the shunt resistor generally refers to a resistor (shunt) which detects a current applied to a load. In case of, for example, the electric power steering apparatus, the shunt resistor is used to detect a motor current value (a motor current detection value) for controlling a feedback of a motor current for a purpose of accurately generating a steering assist torque. This feedback control is performed by adjusting a motor-applied voltage to decrease a difference between the steering assist command value (the current command value) and the motor current detection value.

Then, according to the conventional circuit used for the control unit 30 of the electric power steering apparatus, the shunt resistor is mounted on a transmission line connected to the motor to mount on the substrate. The shunt resistor is connected by a thin line such as a wire and by wire bonding or the like to the transmission line (a signal line) to the current detection circuit which detects the current via the shunt resistor.

Hence, the conventional substrate has a problem that it is additionally necessary to perform a bonding operation of electrically connecting the shunt resistor to the signal line to the current detection circuit. Further, the conventional circuit has a problem, too, that the thin line such as the bonding wire used for the connection causes a measurement error.

Figure 20A:
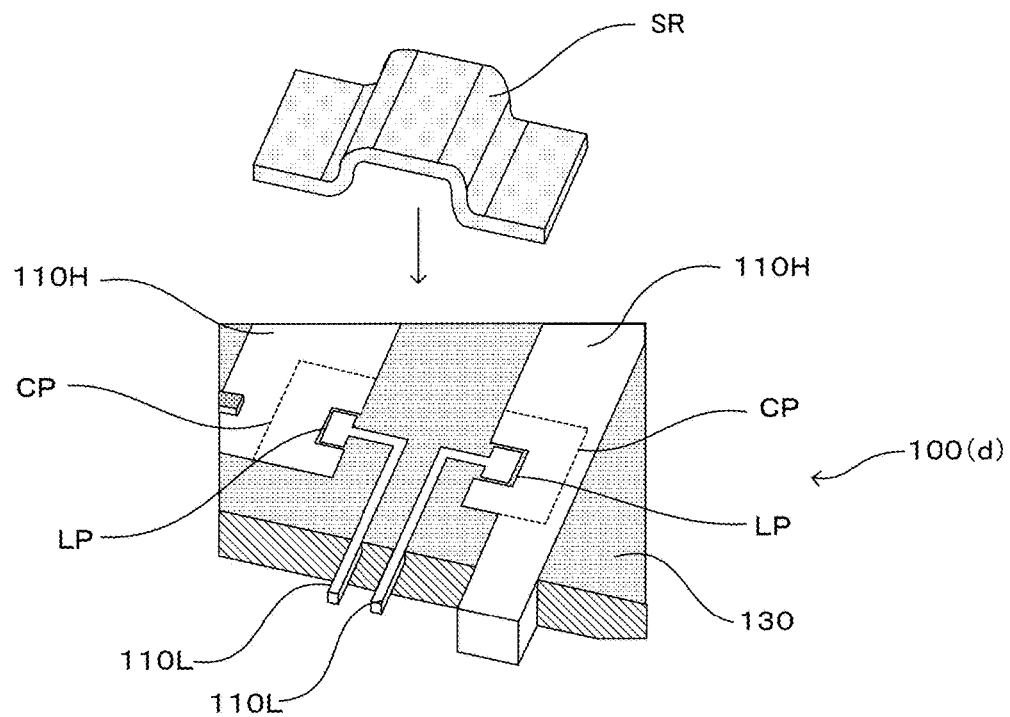
FIGS. 20A and 20B are perspective views illustrating a connection structure of a shunt resistor according to the present invention.
Figure 20B:
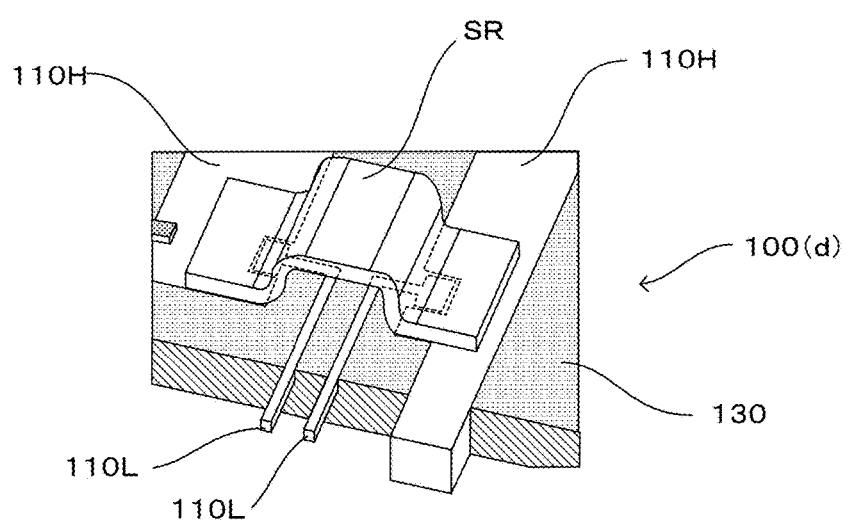

Therefore, by using the electronic part mounting heat-dissipating substrate according to the present invention, and by adopting the connection structure of the shunt resistor illustrated in configuration examples in FIGS. 20A, 20B and subsequent figures, it is possible to solve the above problems. As well, FIGS. 20A and 20B are perspective views illustrating the connection structure of a shunt resistor SR according to the present invention. FIG. 20A is a perspective view illustrating a configuration where the shunt resistor SR is not yet connected to the electronic part mounting heat-dissipating substrate 100(*d*) according to the present invention, and FIG. 20B is a perspective view illustrating a configuration where the shunt resistor SR has been connected to the substrate 100(*d*). Further, FIGS. 20A and 20B illustrate only part of the electronic part mounting heat-dissipating substrate 100(*d*).

According to the configuration example of the present invention, as shown in FIG. 20A, the above electronic part mounting heat-dissipating substrate 100(*d*) includes the lead frames 110 having the different thicknesses. Further, these lead frames 110 comprises the thick lead frames 110H in which a relatively large current is assumed to be flowed, and the thin lead frames 110L in which a relatively small current is assumed to be flowed.

Then, two connection portions CP which are indicated by dotted lines in FIG. 20A and connect two terminals of the shunt resistor SR are provided on the thick lead frames 110H. Besides, the connection portions CP are areas set as portions which connect the shunt resistor SR, and are appropriately positioned according to a circuit arrangement.

Further, cutout portions LP are provided at positions which are part of the connection portions CP set on the lead frames 110H and face each other, and one ends of the thin lead frames 110L are disposed at on the cutout portions LP. Then, the thin lead frames 110L are connected as signal lines to the current detection circuit for which the shunt resistor SR is used.

Furthermore, in assuming a case where, as illustrated in FIG. 20B, the shunt resistor SR is disposed at the connection portions CP of the substrate 100(d) configured described above, the two terminals of the shunt resistor are set covering the cutout portions LP of the connection portions CP from above. Consequently, it is possible to mount the shunt resistor SR on the two types of the lead frames 110L and 110H of the substrate 100(d). Further, since the upper surfaces of the thick lead frames 110H and the thin lead frames 110L at the part mounting surface side are on the identical plane, it is possible to print-solder on the connection portions CP and the cutout portions LP and to perform the connection by way of solder connection by performing a reflow after the SMT (Surface Mount Technology).

Therefore, the connection structure of the shunt resistor for which the electronic part mounting heat-dissipating substrate according to the present invention configured as described above is used can directly extract a current detection signal from the shunt resistor SR. Consequently, it is necessary to perform only the reflow after the SMT without performing the wire bonding process, and it is possible to supply the electronic part mounting heat-dissipating substrate at the low cost. Further, a thin line such as a wire is not used to detect the current as described above, so that it is possible to further improve the current detection precision. Furthermore, according to the present invention, it is possible to form a strong structure by directly mounting parts on the substrate surface by soldering as described above. Therefore, the wire bonding or a method for performing the wire bonding and filling a resin for fixation are unnecessary. Consequently, durability substantially improves in comparison with the connection made by the wire bonding or the like. Thus, it is possible to maintain a stable structure for a long period of time even in, for example, harsh environment in which irregular vibrations and temperature changes of a vehicle body and road surfaces transmitted from the vehicle equipped with the ECU of the electric power steering apparatus are great.

Figure 21A:
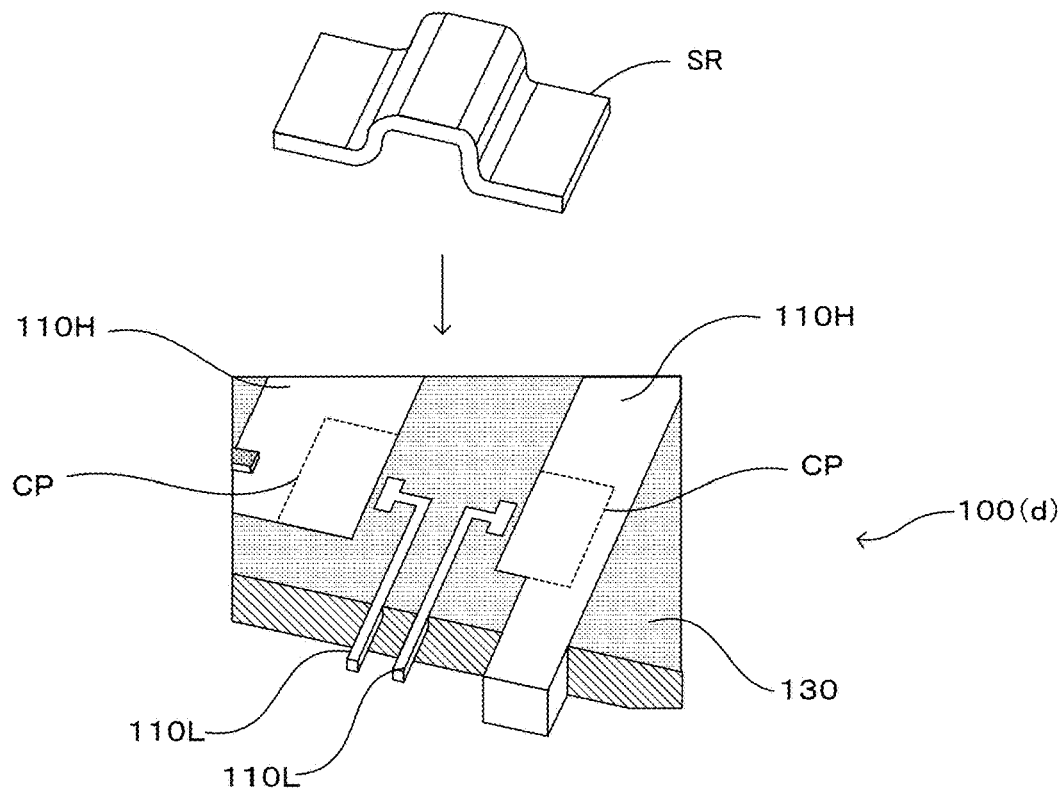
FIGS. 21A and 21B are perspective views illustrating another configuration example of a connection structure of a shunt resistor according to the present invention.
Figure 21B:
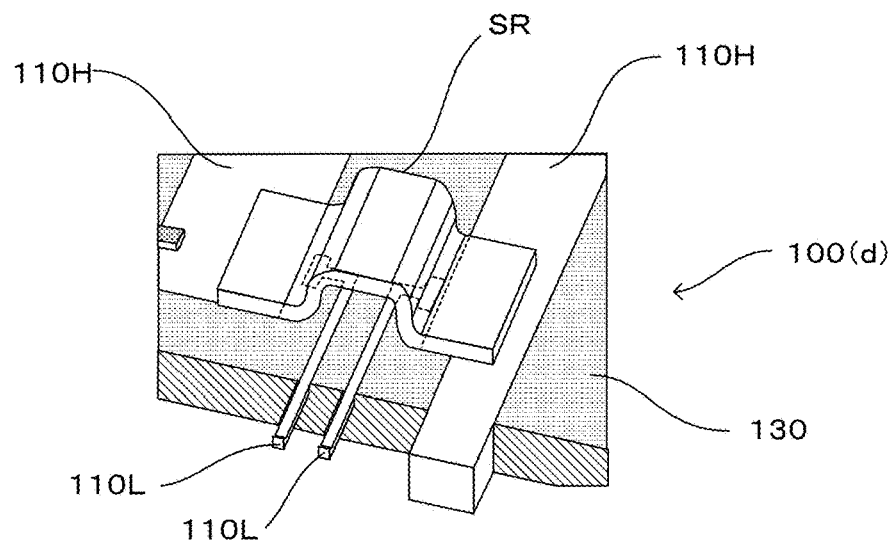

As well, the connection structure of the shunt resistor for which the electronic part mounting heat-dissipating substrate is used is an example of this configuration example. Other configuration examples can be also used without departing from the spirit of the present invention. Hence, the cutout portions LP may not be provided at the connection portions CP and, as illustrated in FIGS. 21A and 21B, one ends of the thin lead frames 110L may be disposed near the connection portions CP. In this regard, FIGS. 21A and 21B illustrate the other configuration examples similar to FIGS. 20A and 20B.

In this case, too, the two terminals of the shunt resistor SR are connected by setting the two terminals of the shunt resistor on the two connection portions set at the upper surface-side of the lead frames 110H. At this time, the one ends of the thin lead frames 110L are also desirably connected directly to lower portions of the two terminals of the shunt resistor SR. (It is possible to indirectly connect the shunt resistor SR to the current detection circuit by connecting the one ends of the thin lead frames 110L to the thick lead frames 110H. However, there is a concern that a wiring resistance increases and causes a measurement error).

Hence, the above "near" means an area which is configured to allow one ends of the lead frames 110L to be disposed below the two terminals of the shunt resistor when the two terminals of the shunt resistor are disposed at the connection portions and at connection portions of the lead frames 110H, and in which the shunt resistor and the lead frames 110L can be directly connected.

Therefore, as described above, according to the another configuration example of the connection structure of the shunt resistor for which the electronic part mounting heat-dissipating substrate according to the present invention is used, it is possible to reduce the cost and improve the current detection precision as described above.

Hence, the present invention employs the above configuration, so that the circuit for which a power semiconductor in which a large current flows is used, can reduce a wiring resistance produced by a large power operation and improve the heat dissipation. By using the electronic part mounting heat-dissipating substrate according to the present invention for the electric power steering apparatus and so on, it is possible to effectively operate these devices.

As well, the substrate composed of the lead frames 110 and the insulating members 130 according to the present invention will be described with reference to FIGS. 23A to 26. For example, this substrate can be formed as follows for example.

Figure 23A:
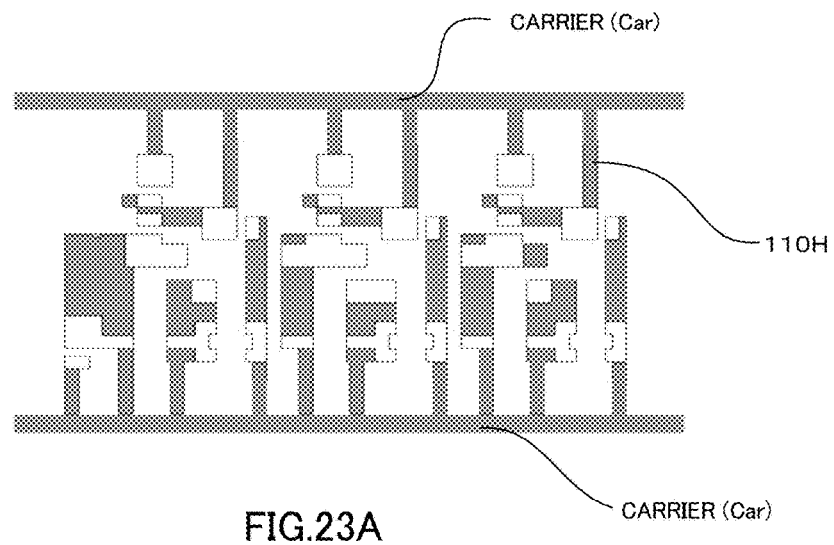
FIG. 23A is a top view illustrating that the thick lead frames are formed and carriers are left at both ends of the frames.

Here, FIGS. 23A to 26 are views for explaining a making example of the substrate in case where the lead frames 110 of the substrate have the different thicknesses. FIG. 23A is a top view illustrating that the thick lead frames 110H are formed and carriers (Car) are left at both ends of the frames. FIG. 23B is a top view illustrating that the thin lead frames 110L are formed and the carriers (Car) are left at both ends of the frames likewise. FIG. 23C is a top view illustrating that the lead frames of the two types illustrated in FIGS. 23B and 23C are combined with the carriers interposed therebetween. Further, FIG. 24A is a side sectional view illustrating an example where the lead frames of the two types combined as illustrated in FIG. 23C are assembled in a mold, and are mutually combined with the insulating members 130 such as resin members. FIG. 24B is a side sectional view illustrating where the lead frames are molded by the mold. FIG. 24C is a top view illustrating that the carriers are detached after the combination. In this regard, FIG. 24C does not illustrate the insulating members 130.

Figure 25:
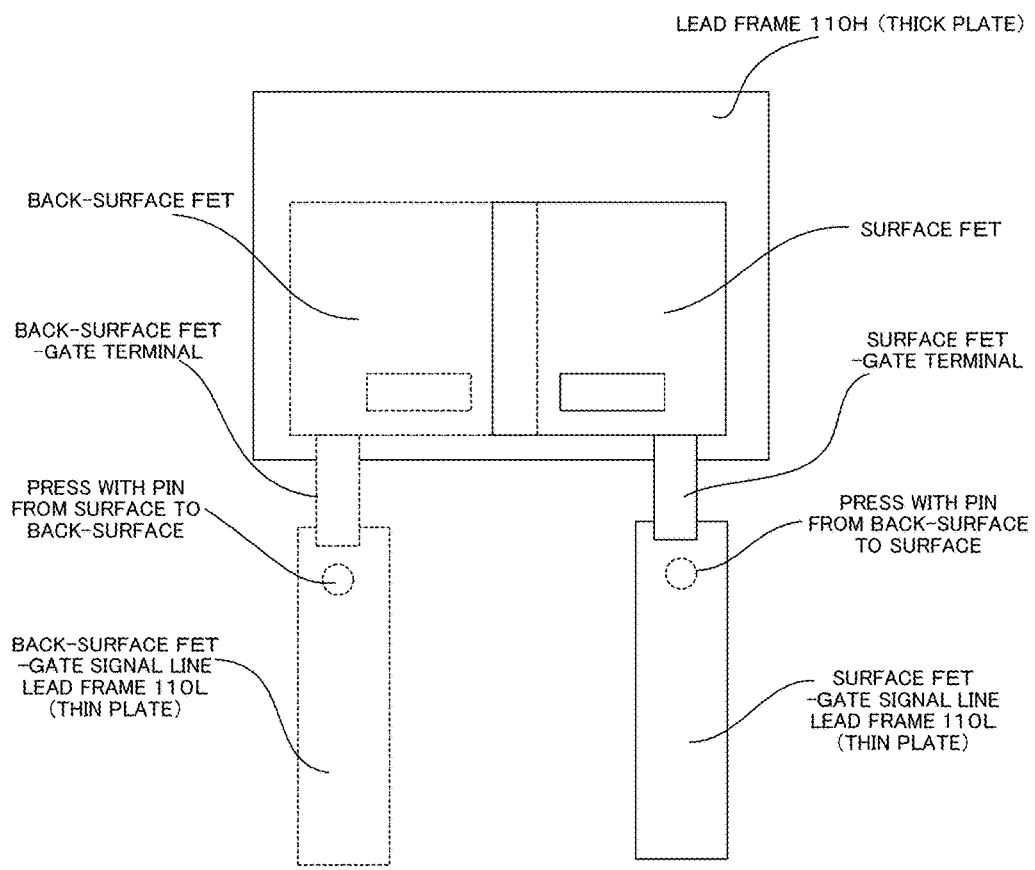
FIG. 25 is a top view illustrating that FETs are mounted on both surfaces of the thick lead frames seen from the upper surface side (top surface side) and is a top view illustrating examples where the thin lead frames are formed on upper and lower surfaces (top and back surfaces) of the substrate.
Figure 26:
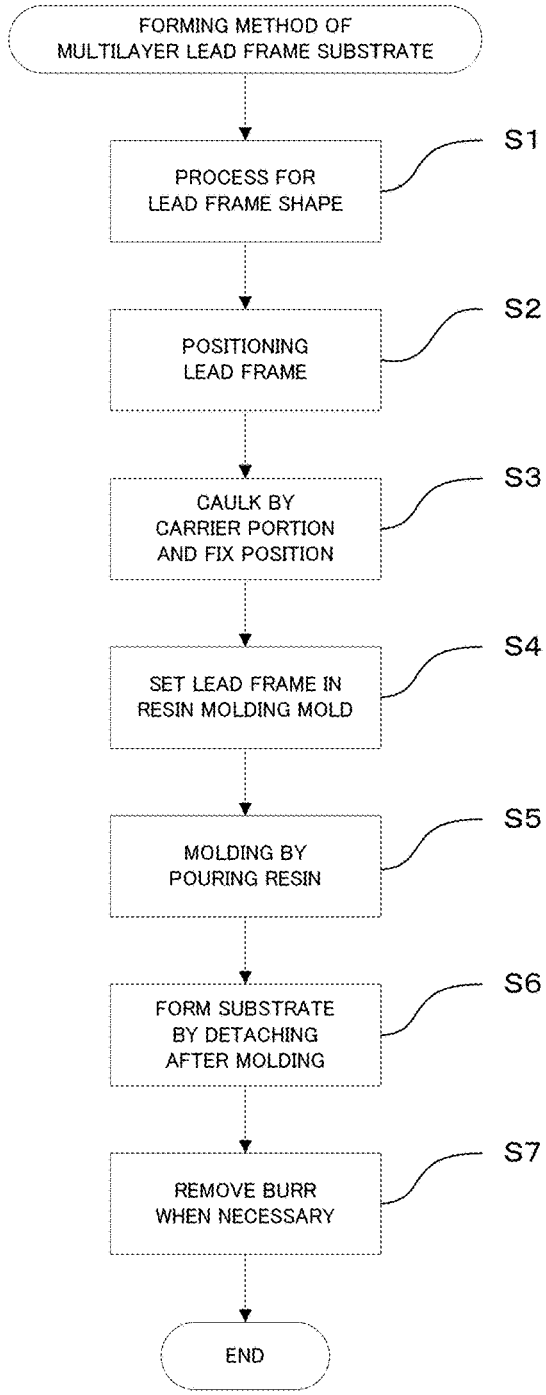
FIG. 26 is a flowchart of forming a substrate (multilayer lead frame substrate) according to the present invention by combining the thin lead frames and the thick lead frames.

Further, FIG. 25 illustrates means which fills the insulating members 130 to dispose the thick lead frames 110H and the thin lead frames 110L on the both surfaces of the substrate. FIG. 25 is a view illustrating a transparent state of a lower surface-side of the top view in case where the thick lead frames 110H and the thin lead frames 110L are disposed on the both surfaces of one substrate, and the electronic parts such as the FETs are mounted on the lead frames 110H and 110L. In this regard, FIG. 25 illustrates the lead frames and the FETs at the back surface-side of the one substrate as dotted lines, and illustrates only gate terminals as terminals from the FETs mounted on the both surfaces of the one substrate. Further, simultaneously, the FETs are mounted on the thick lead frames 110H, and the gate terminals of the FETs are connected to the thin lead frames 110L on the substrate. Furthermore, FIG. 26 is a flowchart of forming a substrate (multilayer lead frame substrate) by combining the thick lead frames and the thin lead frames.

Figure 22A:
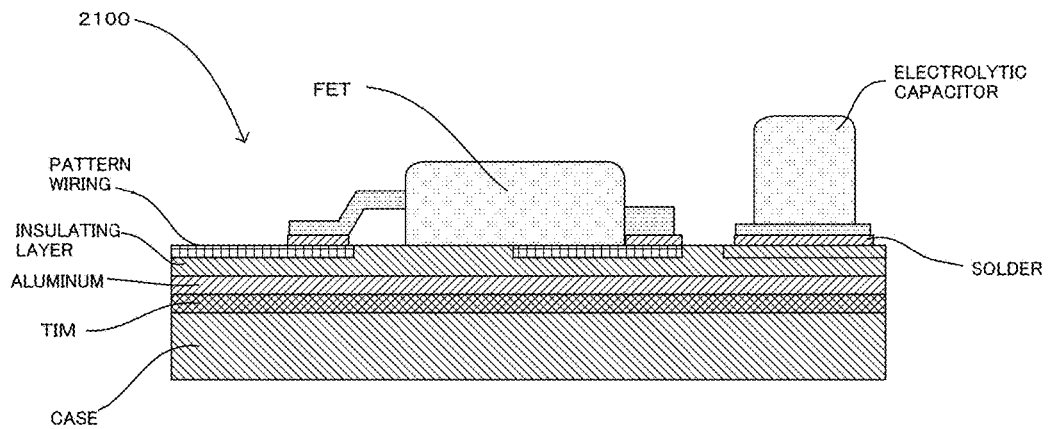
FIG. 22A is a sectional view illustrating an example of a conventional aluminum substrate.
Figure 22B:
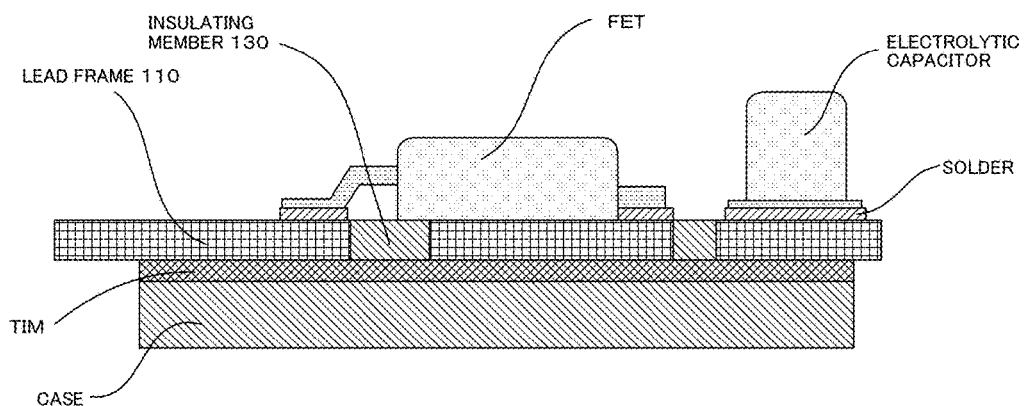
FIG. 22B is a sectional view illustrating an example of the substrate according to the present invention.
Figure 23B:
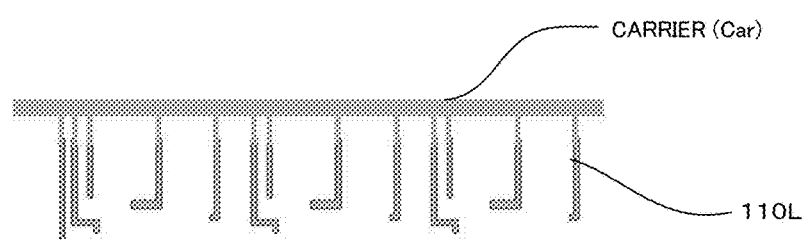
FIG. 23B is a top view illustrating that the thin lead frames are formed and carriers are left at both ends of the frames likewise.

According to the present invention, when the substrate is formed by combining the thick lead frames 110H and the thin lead frames 110L as described above, as illustrated in the flowchart in FIG. 26, shapes of the lead frames are processed first by the conductor plate (Step S1). Then, in this case, as illustrated in FIGS. 23A and 23B, the thick lead frames 110H and the thin lead frames 110L are individually made, and the carriers Car are formed at both side ends of the respective lead frames for subsequent processing. The carriers Car are belt-shaped portions formed at the both side ends of the lead frames as illustrated in FIGS. 22A and 22B, and are formed to maintain forms of the lead frames 110 which are not yet coupled to the insulating members 130 and position the lead frames as described below.

Figure 23C:
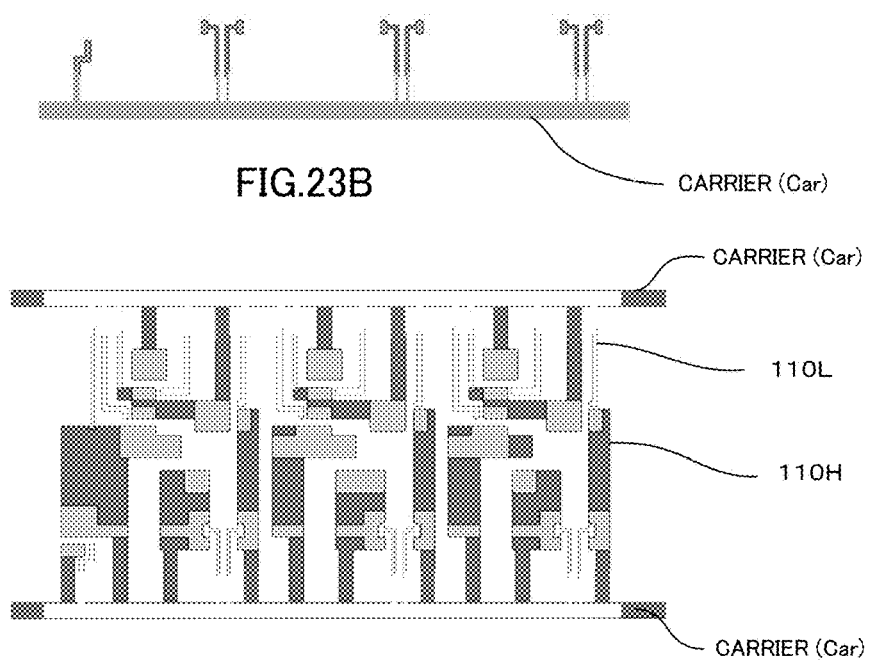
FIG. 23C is a top view illustrating that the lead frames of the two types illustrated in FIGS. 23B and 23C are combined with the carriers interposed therebetween.

Then, after the respective lead frames are formed, the lead frames having the different thicknesses are positioned as shown in FIGS. 23A and 23B (Step S2). Positioning the lead frames is overlaying the lead frames having the different thicknesses and fixing the positions of the lead frames as illustrated in FIG. 23C. For example, the carriers Car of the two lead frames illustrated in FIGS. 23A and 23B are processed in advance for positioning, and the carrier Car portions are caulked by using this processed portions and fixed to prevent the displacement (Step S3).

Figure 24A:
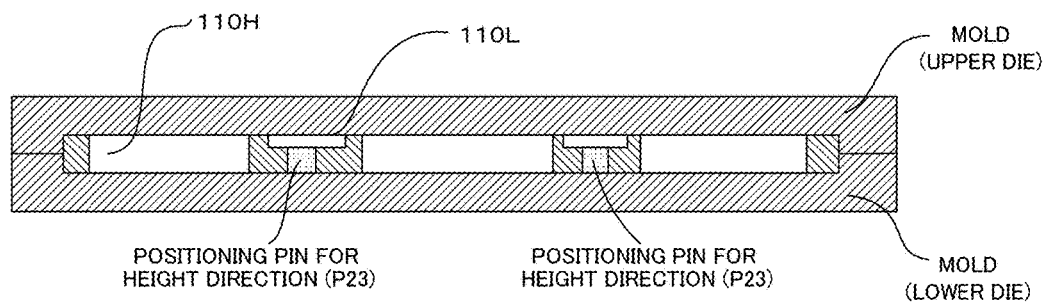
FIG. 24A is a side sectional view illustrating an example where the lead frames of the two types combined as illustrated in FIG. 23C are assembled in a mold, and are mutually combined with insulating members such as resin members.

Next, the lead frames whose positions have been fixed are set in a resin molding mold as illustrated in FIG. 24A (Step S4). The resin molding mold is composed of an upper side die and a lower-side die (an upper die and a lower die), and maintains the shapes of the lead frames to fill a resin composing the insulating members 130. Hence, upward pins (height direction positioning pins (P23)) are configured to be disposed at a lower side of the thin lead frames 110L of the lead frames to hold down the thin lead frames 110L from the lower side to the upper side.

Figure 24B:
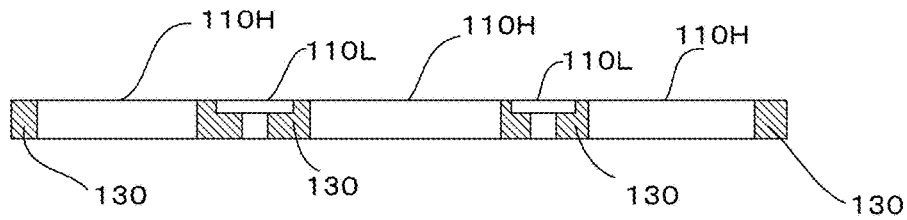
FIG. 24B is a side sectional view illustrating where the lead frames are molded by the mold.
Figure 24C:
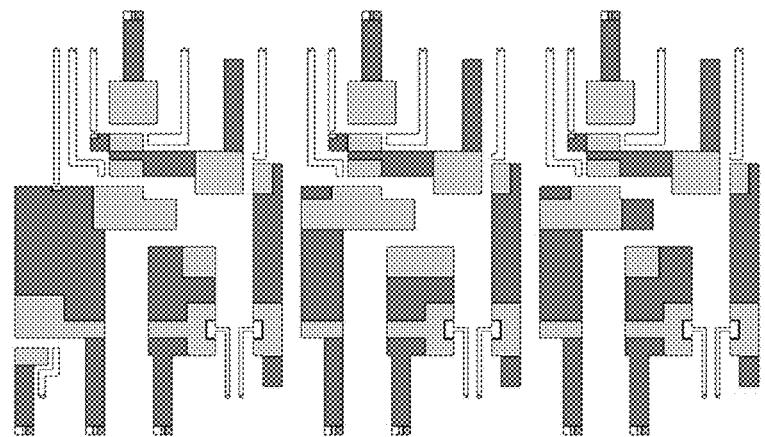
FIG. 24C is a top view illustrating that the carriers are detached after the combination.

Next, the resin composing the insulating members 130 is injected in the mold in which the lead frames have been set to mold (Step S5). After the molding, the mold is detached (Step S6). Consequently, it is possible to obtain the finished substrate according to the present invention as illustrated in FIGS. 24B and 24C. In this regard, the insulating members 130 are not formed at the portions at which the pins P23 are disposed. However, according to use of the substrate according to the present invention or a combination with other components, the insulating members 130 may be additionally filled at this portion or may not be selected. Further, when burrs are made on the substrate surface (the part mounting surface), it is also possible to remove the burrs when necessary and obtain the finished substrate, too (Step S7).

Furthermore, according to the present invention, it is possible to form the substrate according to the present invention as described above. Still further, when the thin lead frames are formed on the both surfaces of the substrate according to the present invention as illustrated in FIGS. 5C and 7C, the lead frames can be formed as follows, for example.

That is, when the thin lead frames 110L are set in the mold as in the Step S6, as illustrated in FIG. 25, the plate surfaces which are the part mounting surfaces of the FETs or the like on the upper-side substrate and the lower-side substrate are disposed without completely overlapping vertical positions passing the plate surfaces of the substrate. In other words, the lead frames 110L are more or less shifted without completely overlapping when the back surface is seen in a transparent state from the upper surface.

Further, according to this structure, this shifted portions, i.e., the portions which are shifted and therefore do not completely overlap when the back surface is seen in a transparent state from the top surface of the electronic part mounting heat-dissipating substrate are used. Thereby, as illustrated in FIG. 25, downward pins P23' provided at the upper mold retain the lead frames 110L at the lower side (back surface side). Similarly, as illustrated in FIG. 25B2, the shifted portions are used. Thereby, the upward pins P23 provided to the lower mold retain the lead frames 110L at the upper side (top surface side). Consequently, it is possible to fill the insulating members 130 made of the resin or the like.

Consequently, according to such a forming method, it is possible to retain the thin lead frames 110L at the top surface side and the back surface side of the substrate by using the downward pins P23' and the upward pins P23. Consequently, by filling the insulating members 130, it is possible to realize a configuration where the thin lead frames 110L are disposed on the both surfaces of the substrate according to the present invention.

EXPLANATION OF REFERENCE NUMERALS

1 handle
2 column shaft (steering shaft, handle shaft)
3 reduction mechanism
4a, 4b universal joint
5 pinion and rack mechanism
6a, 6b tie rod
7a, 7b hub unit
8L, 8R steered wheel
10 torque sensor
11 ignition key
12 vehicle speed sensor
13 battery
14 steering angle sensor
20 motor
30 control unit (ECU)
31 current command value calculating section
33 current limiting section
35 PI-control section
36 PWM-control section (36A: duty calculating section, 36B: gate driving section)
37 inverter
38 motor current detecting means
100(s), 200(s), 300 lead frame having the same thickness electronic part mounting heat-dissipating substrate
100(d), 200(d), 350 lead frame having different thickness electronic part mounting heat-dissipating substrate
100(s, d), 200(s, d) electronic part mounting heat-dissipating substrate (including the lead frames having the same thickness and different thickness)
110, 110(α), 110(β), 110(γ) lead frame
110H lead frame (for large current line)
110M lead frame (for middle current line)
110L lead frame (for small current line (for signal line))
t thickness of lead frame
113 recess portion
113(u) recess portion (surface side)
113(d) recess portion (back surface side)
115 engagement portion
130 insulating member
150 hem portion
500 electronic part mounting heat-dissipating substrate (recess formation example)
800 electronic part mounting heat-dissipating substrate (bendable lead frame example)
900 electronic part mounting heat-dissipating substrate (both surface mount example)
1000 control unit
1100 TIM layer provided at control unit
1300 aluminum die cast forming control unit body
5000 conventional substrate
8000 heat conductor
EC electronic part
bb bus bar
SR shunt resistor
CP connection port
LP cutout
ECU control unit
So solder

The invention claimed is:

1. An electronic part mounting heat-dissipating substrate which comprises: a conductor plate which is formed on lead frames of wiring pattern shapes to mount an electronic part; and an insulating member which is provided between said lead frames of said wiring pattern shapes on said conductor plate; in which a plate surface of an electronic part arrangement surface of said conductor plate and a plate surface of an electronic part arrangement surface-side of said insulating member are formed in an identical vertical plane, and a plate surface of a back surface of said electronic part arrangement surface of said conductor plate and a plate surface of a back surface of said electronic part arrangement surface-side of said insulating member are formed in an identical vertical plane,
   wherein said lead frames of said wiring pattern shapes have different thicknesses of at least two types or more, a thickness of the lead frames being measured in a direction parallel to the mounting direction of the electronic part, and a thick lead frame is used for a large current signal and a thin lead frame is used for a small current signal,
   wherein said plate surface of said back surface of said electronic part arrangement surface of said lead frames of said wiring pattern shapes and said plate surface of said back surface of said electronic part arrangement surface-side of said insulating member are formed in an identical vertical plane to meet said plate surface of said back surface of said electronic part arrangement surface of a thickest lead frame among said lead frames,
   wherein said lead frames having different thicknesses are configured so that different wiring patterns are formed for said respective different thicknesses so as not to mutually cross and overlap and said lead frames having different thicknesses form an electronic circuit by mounting said electronic part,
   wherein wiring widths of thin lead frames are smaller than wiring widths of thick lead frames, and said thin lead frames are arranged between said thick lead frames when said electronic part arrangement surface is seen from an upper side,
   wherein both side surfaces of said lead frames are formed without steps, edge surfaces of said lead frames are 90 degree and are identical plane, with a plane vertical to directly said plate surface from a top surface of said electronic part arrangement surface to a back surface thereof, and
   wherein said electronic part arrangement surface is provided on both surfaces of said electronic part mounting heat-dissipating substrate, a reductant circuit which includes at least similar dual-system circuit is formed on said electronic part mounting heat-dissipating substrate, a first-system circuit of said dual-system circuit is formed on a first surface of said electronic part mounting heat-dissipating substrate, a second-system circuit of said dual-system circuit is formed on a second surface of said electronic part mounting heat-dissipating substrate, and said common lead frames which are commonly used in a portion of a circuit wiring are used to said first surface and said second surface of said electronic part mounting heat-dissipating substrate.

2. The electronic part mounting heat-dissipating substrate according to claim 1, wherein said reductant circuit is an inverter circuit for an electric motor, and said dual-system circuit is provided with respective phases of said inverter circuit.

3. The electronic part mounting heat-dissipating substrate according to claim 1, wherein said lead frames of said different thicknesses are provided in a mixed arrangement.

4. The electronic part mounting heat-dissipating substrate according to claim 2, wherein said lead frames of said different thicknesses are provided in a mixed arrangement.

5. The electronic part mounting heat-dissipating substrate according to claim 1, wherein
   a portion of said plate surface of said electronic part arrangement surface at which said part is not disposed on said plate surface of said electronic part arrangement surface of said lead frames is provided with a top surface side recess portion, and is covered by said insulating member, and
   said top surface of said insulating member which covers said top surface-side recess portion, and said plate surface of said electronic part arrangement surface of said lead frames and said top surface at said electronic part arrangement surface-side of said insulating member form one continuous surface.

6. The electronic part mounting heat-dissipating substrate according to claim 4, wherein
   a portion of said plate surface of said electronic part arrangement surface at which said part is not disposed on said plate surface of said electronic part arrangement surface of said lead frames is provided with a top surface side recess portion, and is covered by said insulating member, and
   said top surface of said insulating member which covers said top surface-side recess portion, and said plate surface of said electronic part arrangement surface of said lead frames and said top surface at said electronic part arrangement surface-side of said insulating member form one continuous surface.

7. The electronic part mounting heat-dissipating substrate according to claim 1, wherein
   a portion corresponding to a back surface of said electronic part arrangement surface at which said part is not disposed on said plate surface of said back surface of said electronic part arrangement surface of said lead frame is provided with a back surface-side recess portion, and is covered by said insulating member, and
   said top surface of said insulating member which covers said back surface-side recess portion, and said plate surface of said back surface of said electronic part arrangement surface of said lead frames and said top surface of said insulating member at said the back surface-side at said electronic part arrangement surface-side form one continuous surface.

8. The electronic part mounting heat-dissipating substrate according to claim 4, wherein
   a portion corresponding to a back surface of said electronic part arrangement surface at which said part is not disposed on said plate surface of said back surface of said electronic part arrangement surface of said lead frame is provided with a back surface-side recess portion, and is covered by said insulating member, and
   said top surface of said insulating member which covers said back surface-side recess portion, and said plate surface of said back surface of said electronic part arrangement surface of said lead frames and said top surface of said insulating member at said the back surface-side at said electronic part arrangement surface-side form one continuous surface.

9. The electronic part mounting heat-dissipating substrate according to claim 1, wherein engagement portions are provided from a side of a surface-side of said lead frames to a side of said insulating member and between said lead frames of said wiring pattern shapes and said insulating member, and said engagement portions are steps formed at sides of a top surface and a back surface of a surface-side of said lead frames and between said lead frames and said insulating member.

10. The electronic part mounting heat-dissipating substrate according to claim 4, wherein engagement portions are provided from a side of a surface-side of said lead frames to a side of said insulating member and between said lead frames of said wiring pattern shapes and said insulating member, and said engagement portions are steps formed at sides of a top surface and a back surface of a surface-side of said lead frames and between said lead frames and said insulating member.

11. The electronic part mounting heat-dissipating substrate according to claim 1, wherein a portion of said lead frames of said wiring pattern shapes formed by said conductor plate have a shape which is bent upward or downward with respect to a plate surface of said conductor plate and at a side closer to an inner side or an outer side than a periphery of said insulating member.

12. The electronic part mounting heat-dissipating substrate according to claim 4, wherein a portion of said lead frames of said wiring pattern shapes formed by said conductor plate have a shape which is bent upward or downward with respect to a plate surface of said conductor plate and at a side closer to an inner side or an outer side than a periphery of said insulating member.

13. The electronic part mounting heat-dissipating substrate according to claim 1, wherein all or a portion of said lead frames of said wiring pattern shapes formed by said conductor plate, is bendably formed at an outward of a periphery of said insulating member.

14. The electronic part mounting heat-dissipating substrate according to claim 1, wherein all or a portion of said lead frames of said wiring pattern shapes formed by said conductor plate, abuts a heat conductor at an outward of a periphery of said insulating member.

15. A power module of an electric power steering apparatus for which said electronic part mounting heat-dissipating substrate according to claim 1 is used.

16. A connection structure of a shunt resistor used for said electronic part mounting heat-dissipating substrate according to claim 1, wherein said electronic part mounting heat-dissipating substrate includes two connection portions which connect two terminals of said shunt resistor on said thickest lead frames, wherein one end of said thin lead frame is disposed at cutout portions formed at part of said two connection portions or near said two connection portions, and wherein a connection of said two terminals of said shunt resistor comprises a structure that said two terminals of said shunt resistor are placed on said two connection portions having said thickest lead frames, and on one end of said thin lead frame which is disposed at cutout portions formed at said two connection portions or on one end of said thin lead frame which is disposed at said two connection portions and near said two connection portions, and are mounted by a solder connection.

17. A connection structure of a shunt resistor used for said power module according to claim 15, wherein said electronic part mounting heat-dissipating substrate includes two connection portions which connect two terminals of said shunt resistor on said thickest lead frames, wherein one end of said thin lead frame is disposed at cutout portions formed at part of said two connection portions or near said two connection portions, and wherein a connection of said two terminals of said shunt resistor comprises a structure that said two terminals of said shunt resistor are placed on said two connection portions having said thickest lead frames, and on one end of said thin lead frame which is disposed at cutout portions formed at said two connection portions or on one end of said thin lead frame which is disposed at said two connection portions and near said two connection portions, and are mounted by a solder connection.

18. An electric power steering apparatus for which said electronic part mounting heat-dissipating substrate according to claim 1 is used.

19. The electric power steering apparatus comprising said connection structure of said shunt resistor according to claim 17.

20. A method for forming a thin lead frames on an electronic part arrangement surface of both surfaces of an electronic part mounting heat-dissipating substrate which includes a conductor plate which is formed on lead frames of wiring pattern shapes; and an insulating member which is provided between said lead frames of said wiring pattern shapes on said conductor plate;

wherein a plate surface of an electronic part arrangement surface of said conductor plate and a top surface of said insulating member at a side of said electronic part arrangement surface form one continuous surface, wherein a plate surface of a back surface of said electronic part arrangement surface of said conductor plate and a top surface of said insulating member at a side of said back surface at said electronic part arrangement surface-side are formed in an identical vertical plane, wherein said lead frames of said wiring pattern shapes have different thicknesses of at least two types or more, a thickness of the lead frames being measured in a direction parallel to the mounting direction of the electronic part, wherein said plate surface of said back surface of said electronic part arrangement surface of said lead frames of said wiring pattern shape, and said top surface of said insulating member at said back surface-side at said electronic part arrangement surface-side are formed in an identical vertical plane to meet said plate surface of said back surface of said electronic part arrangement surface of said thickest lead frame among said lead frames, and wherein said electronic part arrangement surface is provided on both surfaces of said electronic part mounting heat-dissipating substrate, comprising:

forming said thin lead frames more or less shifted without completely overlapping when said back surface is seen in a transparent state from said top surface, wherein, when said substrate is fit into said mold which are composed of an upper die and a lower die in order that said insulating member is filled between said lead frames, by utilizing said thin lead frames more or less shifted without completely overlapping when said back surface is seen in a transparent state from said top surface, said thin lead frames of said back surface side is held by downward pins which are downwardly protruded from said upper die, said thin lead frames of said top surface side is held by upward pins which are upwardly protruded from said lower die, said insulating member is filled between said lead frames, and said thin lead frames are fixed on said electronic part arrangement surface of both surfaces of said electronic part mounting heat-dissipating substrate.

21. A connection structure of a shunt resistor mounted for a substrate, comprises:
    wherein said substrate includes a conductor plate which is formed on lead frames of wiring pattern shapes to mount an electronic part; and an insulating member which is provided between said lead frames of said wiring pattern shapes on said conductor plate,
    wherein a plate surface of an electronic part arrangement surface of said conductor plate and a top surface of said insulating member at a side of said electronic part arrangement surface are formed in an identical surface,
    wherein a plate surface of a back surface of said electronic part arrangement surface of said conductor plate and a top surface of said insulating member at a side of said back surface at said electronic part arrangement surface-side are formed in an identical vertical plane,
    wherein said lead frames of said wiring pattern shapes have different thicknesses of at least two types or more, a thickness of the lead frames being measured in a direction parallel to the mounting direction of the electronic part, and a thick lead frame is used for a large current signal and a thin lead frame is used for a small current signal,
    wherein said plate surface of said back surface of said electronic part arrangement surface of said lead frames of said wiring pattern shapes and said plate surface of said back surface of said electronic part arrangement surface-side of said insulating member are formed in an identical vertical plane to meet said plate surface of said back surface of said electronic part arrangement surface of a thickest lead frame among said lead frames,
    wherein said electronic part arrangement surface is provided on one or both surfaces of said substrate,
    wherein said electronic part mounting heat-dissipating substrate includes two connection portions which connect two terminals of said shunt resistor on said thickest lead frames,
    wherein one end of said thin lead frame is disposed at cutout portions formed at part of said two connection portions or near said two connection portions, and
    wherein a connection of said two terminals of said shunt resistor comprises a structure that said two terminals of said shunt resistor are placed on said two connection portions having said thickest lead frames, and on one end of said thin lead frame which is disposed at cutout portions formed at said two connection portions or on one end of said thin lead frame which is disposed at said two connection portions and near said two connection portions, and are mounted by a solder connection.

22. An electronic part mounting heat-dissipating substrate which comprises: a conductor plate which is formed on lead frames of wiring pattern shapes to mount an electronic part; and an insulating member which is provided between said lead frames of said wiring pattern shapes on said conductor plate; in which a plate surface of an electronic part arrangement surface of said conductor plate and a plate surface of an electronic part arrangement surface-side of said insulating member are formed in an identical vertical plane, and a plate surface of a back surface of said electronic part arrangement surface of said conductor plate and a plate surface of a back surface of said electronic part arrangement surface-side of said insulating member are formed in an identical vertical plane,
    wherein said lead frames of said wiring pattern shapes have different thicknesses of at least two types or more, a thickness of the lead frames being measured in a direction parallel to the mounting direction of the electronic part, and a thick lead frame is used for a large current signal and a thin lead frame is used for a small current signal,
    wherein said plate surface of said back surface of said electronic part arrangement surface of said lead frames of said wiring pattern shapes and said plate surface of said back surface of said electronic part arrangement surface-side of said insulating member are formed in an identical vertical plane to meet said plate surface of said back surface of said electronic part arrangement surface of a thickest lead frame among said lead frames, and
    wherein plural pin-shape cavities are disposed on a substrate surface that is a different surface on which a thin lead frame of said electronic part arrangement surface is provided, and are extended from a back surface side of said substrate of said thin lead frame to said different surface side of said substrate.

\* \* \* \* \*